(12) United States Patent
Wan et al.

(10) Patent No.: US 11,521,914 B2
(45) Date of Patent: Dec. 6, 2022

(54) MICROELECTRONIC ASSEMBLIES HAVING A COOLING CHANNEL

(71) Applicant: Intel Corporation, Santa Clara, CA (US)

(72) Inventors: Zhimin Wan, Chandler, AZ (US); Cheng Xu, Chandler, AZ (US); Yikang Deng, Chandler, AZ (US); Junnan Zhao, Chandler, AZ (US); Ying Wang, Chandler, AZ (US); Chong Zhang, Chandler, AZ (US); Kyu Oh Lee, Chandler, AZ (US); Chandra Mohan Jha, Tempe, AZ (US); Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 832 days.

(21) Appl. No.: 16/233,808

(22) Filed: Dec. 27, 2018

(65) Prior Publication Data

US 2020/0211927 A1 Jul. 2, 2020

(51) Int. Cl.
*H01L 23/473* (2006.01)
*H01L 21/48* (2006.01)

(52) U.S. Cl.
CPC ........ *H01L 23/473* (2013.01); *H01L 21/4882* (2013.01)

(58) Field of Classification Search
None
See application file for complete search history.

(56) References Cited

U.S. PATENT DOCUMENTS

| 8,736,065 | B2 | 5/2014 | Gonzalez et al. | |
|---|---|---|---|---|
| 8,987,892 | B2* | 3/2015 | Davis | H01L 23/473 |
| | | | | 257/712 |
| 9,502,330 | B1* | 11/2016 | Gupta | H01L 23/66 |
| 9,559,088 | B2 | 1/2017 | Gonzalez et al. | |
| 9,711,428 | B2 | 7/2017 | Braunisch et al. | |
| 10,020,243 | B2* | 7/2018 | Fukuoka | H01L 24/49 |
| 10,121,729 | B2* | 11/2018 | Dede | H01L 23/473 |
| 2005/0211418 | A1* | 9/2005 | Kenny | G06Q 20/20 |
| | | | | 257/E23.098 |
| 2009/0057881 | A1* | 3/2009 | Arana | H01L 25/0657 |
| | | | | 257/E21.511 |
| 2009/0284921 | A1* | 11/2009 | Colgan | H01L 23/473 |
| | | | | 361/699 |
| 2017/0263531 | A1* | 9/2017 | Fukuoka | H01L 23/3672 |
| 2017/0263532 | A1* | 9/2017 | Fukuoka | H01L 29/1608 |

(Continued)

*Primary Examiner* — Evren Seven
(74) *Attorney, Agent, or Firm* — Akona IP

(57) ABSTRACT

Microelectronic assemblies that include a cooling channel, and related devices and methods, are disclosed herein. For example, in some embodiments, a microelectronic assembly may include a package substrate having a surface, a die having a surface, and a fluidic channel between the surface of the die and the surface of the package substrate, wherein a top surface of the fluidic channel is defined by the surface of the die and a bottom surface of the fluidic channel is defined by the surface of the package substrate. In some embodiments, a microelectronic assembly may include a package substrate having a surface; a die having a surface; and an interposer having a fluidic channel between the surface of the die and the surface of the package substrate.

13 Claims, 12 Drawing Sheets

(56) References Cited

U.S. PATENT DOCUMENTS

2018/0025962 A1\* 1/2018 Dede ................. H01L 23/367
                                                                                257/712
2018/0226310 A1\* 8/2018 Eid .................... H01L 23/12
2020/0013699 A1\* 1/2020 Liu .................... H01L 24/80
2021/0166991 A1\* 6/2021 Liu .................... G02B 6/30

\* cited by examiner

MICROELECTRONIC ASSEMBLIES HAVING A COOLING CHANNEL

BACKGROUND

Electronic components, such as microprocessors and integrated circuits, generally produce heat. Excessive heat may degrade performance, reliability, and life expectancy of an electronic component and may even cause component failure. Heat sinks, heat spreaders, heat pipes, and other similar thermal solutions are commonly used for dissipating heat and reducing the operational temperature of electronic components.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
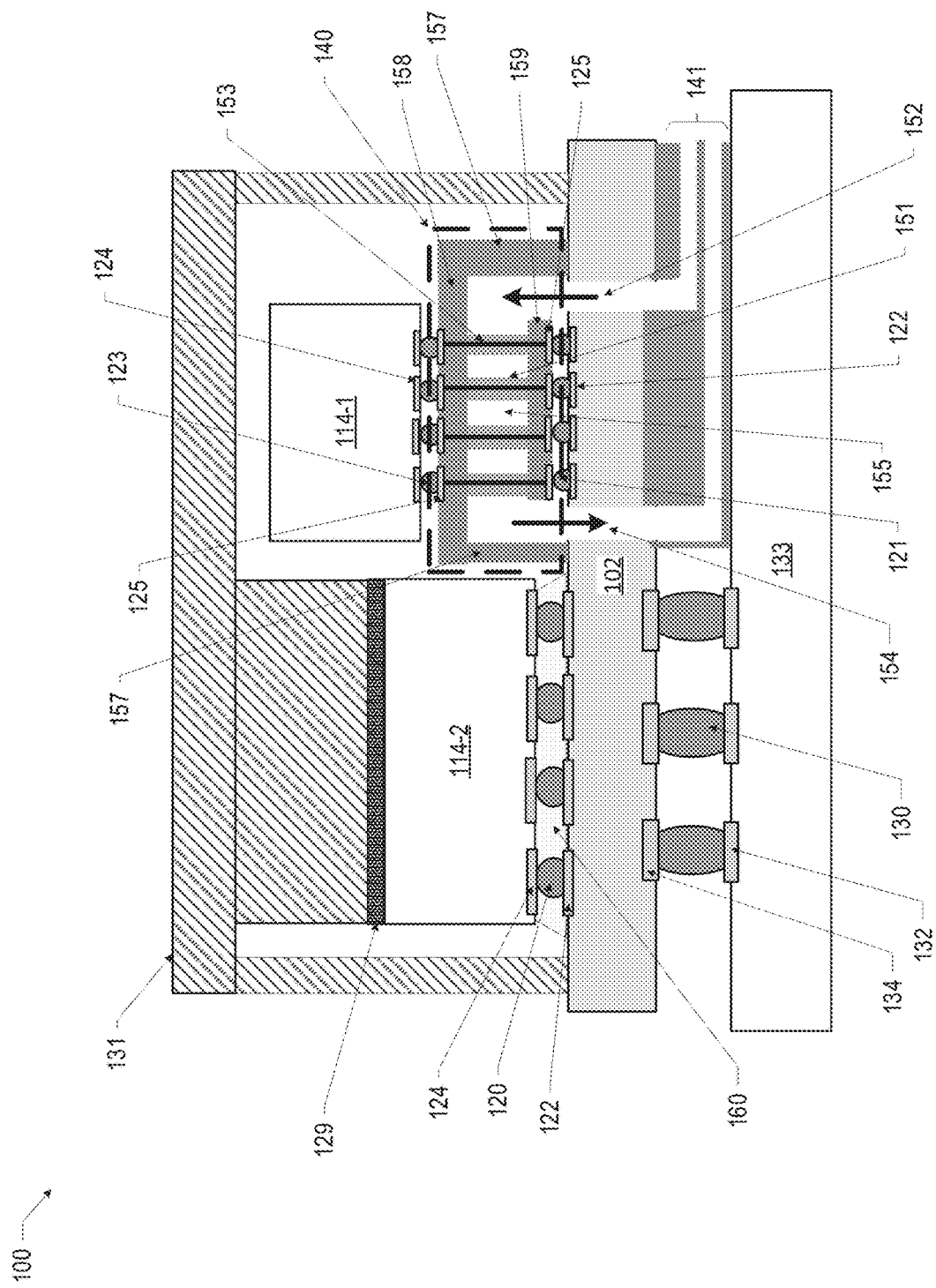
FIG. 1 is a side, cross-sectional view of an example microelectronic assembly having a cooling interposer, in accordance with various embodiments.

Microelectronic assemblies that include a cooling interposer, and related devices and methods, are disclosed herein. For example, in some embodiments, a microelectronic assembly may include a package substrate having a surface; a die having a first surface and an opposing second surface; and an interposer having a fluidic channel between the first surface of the die and the surface of the package substrate. In some embodiments, a microelectronic assembly may include a package substrate having a surface, a die having a first surface and an opposing second surface, and a fluidic channel between the first surface of the die and the surface of the package substrate. In some embodiments, a microelectronic assembly may include a package substrate having a surface, a die having a surface, and a fluidic channel between the surface of the die and the surface of the package substrate, wherein the fluidic channel is defined by the first surface of the die and by the surface of the package substrate.

Some conventional integrated circuit (IC) devices may include a cooling apparatus, such as a microchannel, a heat spreader, a heat sink, or a cold plate, in order to transport heat generated by the electronic component during operation away from the electronic component. Typically, a cooling apparatus is in thermal contact with a back side (e.g., the side away from the package substrate) of an electronic component on an IC package and transfers heat via thermal conduction. As IC devices become smaller, the power density increases as well as non-uniform heat generation. For example, an electronic component may generate heat non-uniformly such that a surface (e.g., an active side or a back side) of the electronic component may have localized high heat flux zones, commonly referred to as hotspots. An electronic component may create varying amounts of heat on a surface and a varying amount of heat as a function of time. A smaller and more efficient IC device cooling apparatus may be desirable for managing hotspots on an active surface of an electronic component. The microelectronic assemblies disclosed herein may be particularly advantageous for high-performance computing, and multiple-chip IC packages.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features. As used herein, a dimension in the x-direction is a length, a dimension in the y-direction is a width, and a dimension in the z-direction is a thickness or a height.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." As used herein, a "cooling interposer" and an "interposer" may be used interchangeably. As used herein, a "channel" and a "fluidic channel" may be used interchangeably. The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and Y" represents a range that includes X and Y. For convenience, the phrase "FIG. 3" may be used to refer to the collection of drawings of FIGS. 3A-3G, the phrase "FIG. 5" may be used to refer to the collection of drawings of FIGS. 5A-5D, etc. Although certain elements may be referred to in the singular herein, such elements may include multiple sub-elements. For example, "an insulating material" may include one or more insulating materials, and a "conductive layer" may include one or more conductive layers.

FIG. 1 is a side, cross-sectional view of a microelectronic assembly 100, in accordance with various embodiments. The microelectronic assembly 100 may include a package substrate 102, a die 114-1, and a cooling interposer 140, as indicated by the dotted lines, between the die 114-1 and the package substrate 102. The cooling interposer 140 may be in thermal contact with the die 114-1 to spread heat from the die 114-1. In some embodiments, the cooling interposer 140 may be in thermal contact with a hotspot on the surface of the die 114-1. The cooling interposer 140 may include a channel 155 for a fluid, a fluid inlet 152, and a fluid outlet 154. In some embodiments, as shown in FIG. 1, the package substrate 102 may include one or more through holes for connecting the fluid inlet 152 and fluid outlet 154 to fluid pathways 141 between the package substrate 102 and a circuit board 133 for circulating fluid through the cooling interposer 140.

The cooling interposer 140 may include a single channel 155 formed by a bottom portion 159, a top portion 158, or lid, and two or more sidewalls 157. In some embodiments, the cooling interposer 140 may be an enclosed structure for containing fluid, such that the cool interposer may include a bottom portion 159, a top portion 158, four sidewalls 157, a fluid inlet 152, and a fluid outlet 154. The fluid inlet 152 and the fluid outlet 154 may be openings formed in the bottom portion 159 and/or the top portion 158 for flowing fluid through the cooling interposer 140. In some embodiments, as shown in FIG. 1, the cooling interposer 140 may include a plurality of channels 155 formed by one or more vertical structures 151. In some embodiments, the vertical structures 151 may include conductive structures 153. The channel 155 may be a hollow structure filled with a fluid. During operation of the cooling interposer 140, a fluid may enter via the fluid inlet 152, may flow through the one or more channels 155, and may exit via the fluid outlet 154. The fluid may be circulated through the system via the fluid pathways 141 using a pump or a fan, which may be a separate piece of equipment or may be part of a cooling device. The microelectronic assembly 100 may further include pipes or connections to a heat exchanger, a chiller, or other device for cooling the fluid (not shown) before returning the fluid to the fluid inlet. The fluid may be any suitable liquid or gas, such as a coolant (e.g., water, fluorochemical liquids, silicone oil, ethylene glycol water, poly-alpha-olefin, or silicate ester), or helium, argon, or nitrogen, that may be circulated, usually by a pump or a fan (not shown), to dissipate heat more efficiently from the first surface of the die 114-1. The fluid may also include additives to prevent corrosion of the different components or to allow operation at higher/lower temperatures (e.g., additives to water to decrease its freezing point or increase its boiling point). The coolant used may depend on the coolant's properties, including viscosity and heat capacity, circulation flow rate, and the temperature rise during device operation. In some embodiments, the fluid may be an electronic coolant liquid or a dielectric fluid that is electrically insulating, highly thermally stable, non-toxic, chemically inert, non-corrosive with high thermal conductivity, such that the liquid may be in direct contact with a die 114 and/or a package substrate 102 (e.g., via unsealed channels). A dielectric fluid may include a dielectric material in a liquid state. For example, the fluid may be an ultra-low-viscosity dielectric heat transfer fluid that includes synthetic hydrocarbon oils. In some embodiments, the fluid may not include sulfur. In some embodiments, the fluid may include a transformer oil, perfluoroalkanes, and purified water.

The cooling interposer 140 may be formed using any suitable material, including silicon, glass, boron arsenide, or silicon carbide, and using any suitable technique, including deep reactive ion etching. For example, the channel 155 may be formed from an active or inactive interposer by boring out silicon material using reactive ion etching (RIE), chemical etching, mechanical drilling, or laser ablation. The conductive structures 153 may be formed using any suitable conductive material, including copper, silver, nickel, gold, aluminum, or other metals or alloys, for example, and using any suitable technique, including through silicon via (TSV) formation techniques, such as electroplating, or inkjet printing. The conductive structures 153 may serve as electrical connections and/or as heat spreaders to dissipate heat from the die 114-1. In some embodiments, the cooling interposer 140 may be manufactured separately (e.g., as a pre-fabricated assembly) and surface-mounted to the package substrate 102, as described below with reference to FIG. 3.

In some embodiments, the conductive structures 153 of the vertical structures 151 may electrically couple the package substrate 102 and the die 114-1. In particular, the package substrate 102 may include first conductive contacts 134 on a first surface and second conductive contacts 122 on an opposing second surface, the die 114 may include conductive contacts 124 on a first surface and an opposing second surface, and the conductive contacts 124 on the first surface of the die may be coupled to the second conductive contacts 122 on the second surface of the package substrate via the conductive structures 153 of the cooling interposer 140, package substrate-to-interposer (PSTI) interconnects 121, and die-to-interposer (DTI) interconnects 123. The PSTI interconnects 121 and the DTI interconnects 123 illustrated in FIG. 1 are solder balls (e.g., for a ball grid array arrangement), but any suitable interconnects may be used (e.g., pins in a pin grid array arrangement or lands in a land grid array arrangement). In some embodiments, the PSTI interconnects 121 and the DTI interconnects 123 may include solder bumps. In some embodiments, the conductive structures 153 of the cooling interposer 140 may further include conductive pads 125 on the top surface and bottom surface of the cooling interposer 140. In some embodiments, an underfill material (not shown), such as a mold compound or an epoxy, may be disposed around the PSTI interconnects 121 and/or the DTI interconnects 123. In some embodiments, no underfill material may be disposed around the PSTI interconnects 121 or the DTI interconnects 123.

The microelectronic assembly 100 may further include a die 114-2 having conductive contacts 124 on a first surface and an opposing second surface. The conductive contacts 124 on the first surface of the die 114-2 may be coupled to the second conductive contacts 122 on the second surface of the package substrate 102 via first-level interconnects 120. In some embodiments, an underfill material 160, such as a mold compound or an epoxy, may be disposed around the first-level interconnects 120. In some embodiments, no underfill material may be disposed around the first-level interconnects 120. The underfill material 160 may be selected to have a coefficient of thermal expansion (CTE) that may mitigate or minimize the stress between the cooling interposer 140 and the die 114-1 and/or the package substrate 102 or between the die 114-2 and the package substrate 102 arising from uneven thermal expansion in the microelectronic assembly 100. In some embodiments, the CTE of the underfill material 160 may have a value that is intermediate to the CTE of the package substrate 102 (e.g., the CTE of the dielectric material of the package substrate 102) and a CTE of the dies 114. In some embodiments, the underfill material 160 may extend around one or more of the dies 114 and may serve as a mold material.

The die 114 may include any suitable circuitry. For example, in some embodiments, the die 114 may be an active or passive die, and the die 114 may include input/output circuitry, a processor, high-bandwidth memory, or enhanced dynamic random access memory (EDRAM). In some embodiments, the die 114-2 in a microelectronic assembly 100 may be a processing device (e.g., a central processing unit (CPU), a graphics processing unit (GPU), a field programmable gate array (FPGA), a modem, an applications processor, etc.), and the die 114-1 may include high-bandwidth memory, cache memory, transceiver circuitry, and/or input/output circuitry (e.g., Double Data Rate transfer circuitry, Peripheral Component Interconnect Express circuitry, etc.). In some embodiments, the die 114 may include a single die. In some embodiments, the die 114 may include a plurality of stacked dies, such as wafer stacked, die stacked, or multi-layer die stacked.

The package substrate 102 may include an insulating material (e.g., a dielectric material formed in multiple layers, as known in the art) and one or more conductive pathways through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), BT resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). The conductive pathways (not shown) in the package substrate 102 may couple any of the dies 114 to the circuit board 133 (e.g., via the first-level interconnects 120 and second-level interconnects 130). In particular, when the package substrate 102 is formed using standard printed circuit board (PCB) processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable. The package substrate 102 may have any suitable dimensions. In some embodiments, the thickness (e.g., z-height) of the package substrate 102 may be between 0.1 millimeters and 3 millimeters (e.g., between 0.3 millimeters and 2 millimeters, between 0.25 millimeters and 0.8 millimeters, or approximately 1 millimeter).

The microelectronic assembly of FIG. 1 may also include a circuit board 133 having conductive contacts 132 on a surface. The first conductive contacts 134 on the first surface of the package substrate 102 may be coupled to the conductive contacts 132 on the circuit board 133 by second-level interconnects 130. The second-level interconnects 130 illustrated in FIG. 1 are solder balls (e.g., for a ball grid array arrangement), but any suitable second-level interconnects 130 may be used (e.g., pins in a pin grid array arrangement or lands in a land grid array arrangement). The circuit board 133 may be a motherboard, for example, and may have other components attached to it (not shown). The circuit board 133 may include conductive pathways and other conductive contacts (not shown) for routing power, ground, and signals through the circuit board 133, as known in the art. In some embodiments, the second-level interconnects 130 may not couple the package substrate 102 to a circuit board 133, but may instead couple the package substrate 102 to another IC package, an interposer, or any other suitable component.

The microelectronic assembly 100 of FIG. 1 may also include a heat spreader 131. The heat spreader 131 may be used to move heat away from the die 114-2 (e.g., so that the heat may be more readily dissipated by a heat sink or other thermal management device). The heat spreader 131 may include any suitable thermally conductive material (e.g., metal, appropriate ceramics, etc.), and may include any suitable features (e.g., fins). In some embodiments, the heat spreader 131 may be an integrated heat spreader. In some embodiments, the heat spreader 131 may include an extended portion, or pedestal along the z-height, to provide physical contact with a thermal interface material (TIM) 129 on die 114-2.

The microelectronic assembly 100 of FIG. 1 may also include a TIM 129 between the die 114-2 and the heat spreader 131. The TIM 129 may include a thermally conductive material (e.g., metal particles) in a polymer or other binder. The TIM 129 may be a thermal interface material paste or a thermally conductive epoxy (which may be a fluid when applied and may harden upon curing, as known in the art). The TIM may include a solder TIM. The TIM 129 may be disposed on the second surface of the die 114-2 and may provide a path for heat generated by the die 114-2 to readily flow to the heat spreader 131, where it may be spread and/or dissipated. In some embodiments, a TIM (not shown) may be disposed between the second surface of the die 114-1 and the heat spreader 131.

Although FIG. 1 depicts a single, surface-mounted cooling interposer 140 in thermal contact with a single die 114-1, the microelectronic assemblies 100 disclosed herein may have any suitable number of cooling interposers 140 and dies 114-1 in thermal contact; for example, additional surface-mounted cooling interposers 140 may be in thermal contact with one or more dies 114-1. More generally, the microelectronic assemblies 100 disclosed herein may have any suitable arrangement and any number of cooling interposers 140, and any number of the dies 114. Further, although FIG. 1 shows a particular arrangement of the fluidic system (e.g., the fluid inlet, the fluid outlet, and the fluid pathways), a cooling interposer may have any suitable arrangement of the fluidic system, including, for example, the fluidic systems described below with reference to FIG. 4.

A number of elements in FIG. 1 are illustrated as being included in the microelectronic assembly 100, but a number of these elements may not be present in microelectronic assembly 100. For example, in various embodiments, the heat spreader 131, the TIM 129, the underfill material 160, the second-level interconnects 130, and/or the circuit board 133 may not be included. Further, FIG. 1 illustrates a number of elements that are omitted from subsequent drawings for ease of illustration, but may be included in any of the microelectronic assemblies 100 disclosed herein. Examples of such elements include the heat spreader 131, the TIM 129, the underfill material 160, the second-level interconnects 130, and/or the circuit board 133. Many of the elements of the microelectronic assemblies 100 of FIG. 1 are included in other ones of the accompanying figures; the discussion of these elements is not repeated when discussing these figures, and any of these elements may take any of the forms disclosed herein. A number of elements are not illustrated in FIG. 1, but may be present in microelectronic subassemblies 100; for example, additional active components, such as dies, or additional passive components, such as surface-mount resistors, capacitors, and/or inductors, may be disposed on the top surface or the bottom surface of the package substrate 102, and may be thermally connected to one or more cooling interposers 140.

Figure 2A:
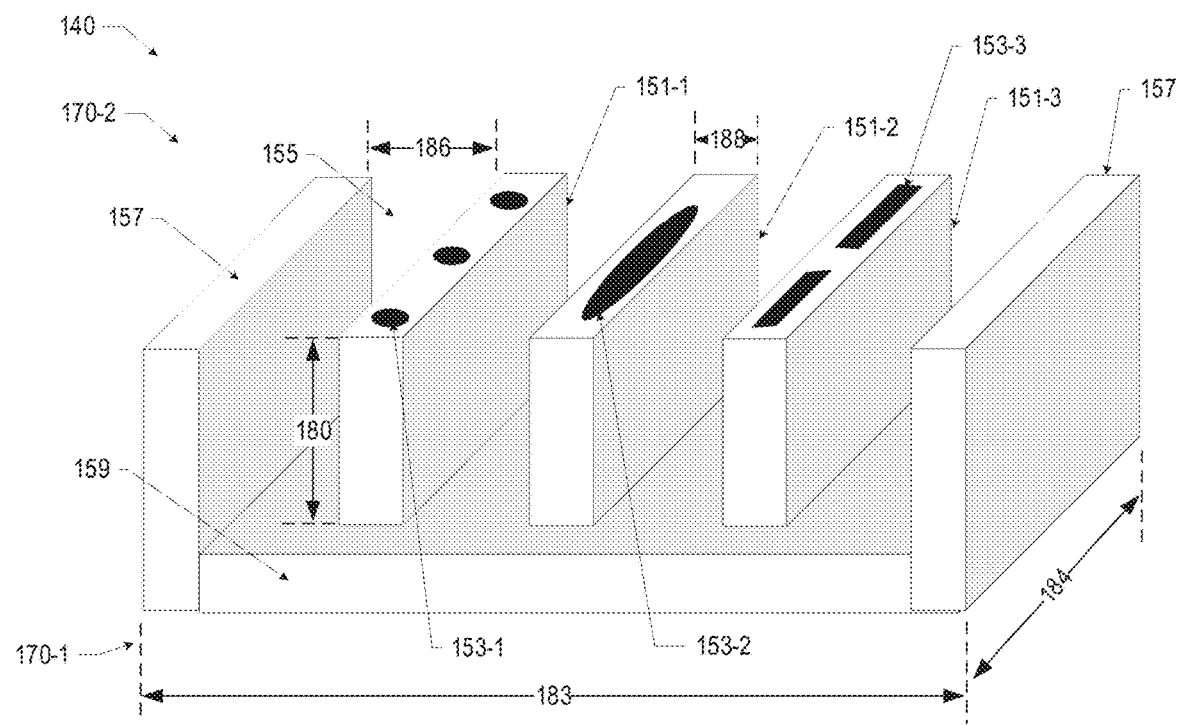
FIGS. 2A and 2B are perspective views of example cooling interposers without a lid, in accordance with various embodiments.

FIG. 2A is a perspective view of an example cooling interposer 140 without a lid and without the front and back sidewalls, in accordance with various embodiments. As shown in FIG. 2A, the cooling interposer 140 may include a bottom portion 159, a top portion (not shown), sidewalls 157, and three vertical structures, or walls, 151-1, 151-2, and 151-3 to form four channels 155. In some embodiments, a width 186 of an individual channel 155 (e.g., a space between a vertical structure 151 and an adjacent vertical structure 151 or sidewall 157) may be between 20 microns (um) and 400 um. The vertical structures 151 may include conductive structures 153. For example, vertical structure 151-1 may include conductive structures 153-1 formed as three conductive pillars or columns with circular cross-sections, vertical structure 151-2 may include conductive structure 153-2 formed as a conductive pillar having an oval cross-section, and vertical structure 151-3 may include conductive structures 153-3 formed as two conductive pillars having rectangular cross-sections. The vertical structures 151 may have any suitable dimensions. For example, the vertical walls 151-1, 151-2, 151-3 may have a thickness 180 between 100 um and 1000 um (e.g., z-height, measured from the top surface of the bottom portion 159 to the bottom surface of the top portion), and a length (e.g., x-dimension) 188 between 20 micron (um) and 400 um. The vertical structure 151 may have a width (e.g., y-dimension) between 20 um and 400 um. The conductive structures 153 may have any suitable dimensions. For example, the conductive structures 153 may extend from a bottom surface 170-1 to the top surface 170-2, including the lid, of the cooling interposer 140, such that the thickness (e.g., z-height) of an individual conductive structure 153 is about equal to the thickness of the cooling interposer 140. The conductive structures 153 may have any suitable size and shape. In some embodiments, one or more of the conductive structures 153 may be omitted.

The cooling interposer 140 may have any suitable dimensions and any suitable shape. For example, in some embodiments, the cooling interposer 140 may have an x-y dimension (e.g., length by width) between 20 square microns (um$^2$) and 1 square millimeter (mm$^2$), such that the x-dimension 183 may be between 20 um and 1 mm, and the y-dimension 184 may be between 20 um and 1 mm. In some embodiments, the cooling interposer 140 may be square, such that an x-dimension is equal to a y-dimension. In some embodiments, the cooling interposer 140 may be rectangular, such that an x-dimension is different from a y-dimension. In some embodiments, the x-y dimensions of the cooling interposer 140 may be circular, triangular, hexagonal, or any other suitable shape. In some embodiments, the cooling interposer 140 may have an overall height (z-dimension, not shown) measured from the bottom surface 170-1 to the top surface 170-2, including the lid, between 0.3 mm and 2 mm. In some embodiments, the x-y dimensions of the cooling interposer 140 may have a same x-y dimensions as a die 114.

Figure 2B:
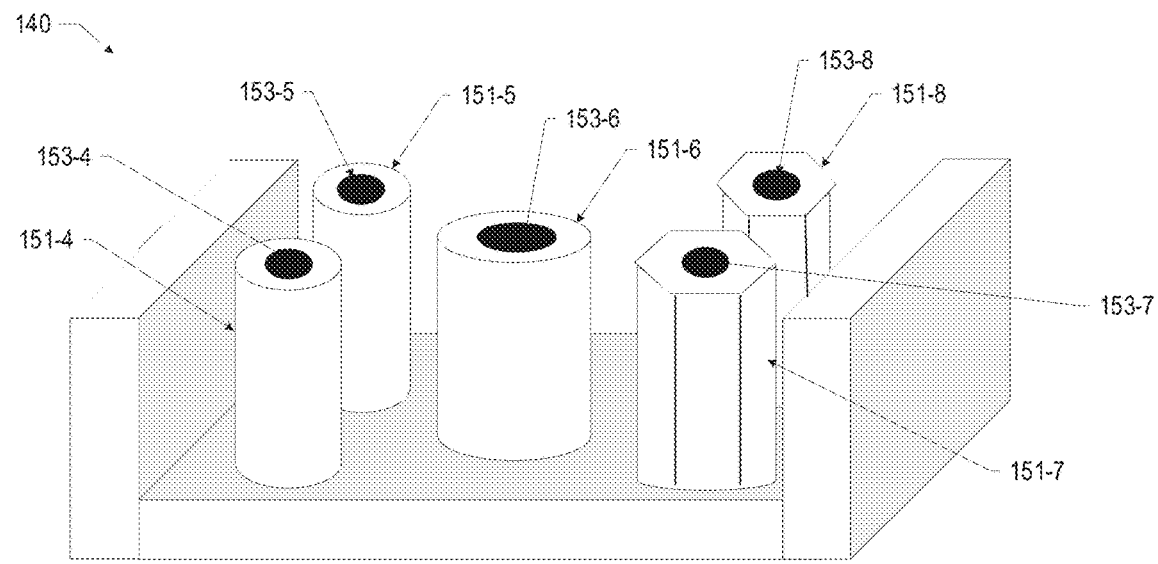

FIG. 2B is a perspective view of an example cooling interposer 140 without a lid and without the front and back sidewalls, in accordance with various embodiments. In some embodiments, the vertical structures may include pillars or posts having any cross-sectional shape, including round, oblong, square, rectangular, triangular, diamond, teardrop, and hexagonal, among others. As shown in FIG. 2B, the cooling interposer 140 may include a plurality of vertical structures formed as pillars 151-4-151-8. The vertical structures 151-4-151-8 may include conductive structures 153-4-153-8, respectively. The vertical pillars 151-4-151-8 may have any suitable size and shape. For example, as shown in FIG. 2B, the vertical pillars may have a circular cross-section (e.g., 151-4, 151-5), an oval cross-section (e.g., 151-6), and a hexagonal cross-section (e.g., 151-7, 151-8). The conductive structures 153 may have any suitable size and shape. In some embodiments, one or more of the conductive structures 153 may be omitted.

Although FIGS. 2A and 2B illustrate a particular number and arrangement of vertical structures 151 and conductive structures 153 in the cooling interposer 140, these are simply illustrative. The cooling interposer 140 may have any suitable number, shape, and arrangement of vertical structures 151 and conductive structures 153 to form channels for fluid flow and to form conductive pathways between the die 114 and the package substrate 102. As shown in FIG. 2, the conductive structures 153 may have any suitable shape. For example, in some embodiments, the conductive structures may include slabs, pillars, or posts having any cross-sectional shape, including round, oblong, square, rectangular, triangular, diamond, teardrop, and hexagonal, among others. The vertical structures 151 may have any suitable arrangement, including a symmetrical array (e.g., linear rows and columns), or an asymmetrical array (e.g., offset rows and columns, or areas having higher densities of conductive structures). The vertical structures 151 disclosed herein (e.g., vertical walls and/or vertical pillars) may be formed of any suitable dielectric material, including silicon, epoxy, or plastic. The conductive structures 153 disclosed herein may be formed of any suitable conductive material, such as copper, silver, nickel, gold, aluminum, or other metals or alloys, for example.

The elements of the microelectronic assembly 100 may have any suitable dimensions. For example, in some embodiments, a thickness of the package substrate 102 may be between 0.25 mm and 3 mm (e.g., between 0.25 mm and 2 mm, between 0.4 mm and 0.6 mm, or approximately 0.5 mm). In some embodiments, the package substrate may have an x-y dimension of between 4 square millimeters (mm$^2$) and 2000 mm$^2$.

Any suitable techniques may be used to manufacture the microelectronic assemblies disclosed herein. For example, FIGS. 3A-3G are side, cross-sectional views of various stages in an example process for manufacturing an example microelectronic assembly 100, in accordance with various embodiments. Although the operations discussed below with FIGS. 3A-3G (and others of the accompanying drawings representing manufacturing processes) are illustrated in a particular order, these operations may be performed in any suitable order. Additionally, although particular assemblies are illustrated in FIGS. 3A-3G (and others of the accompanying drawings representing manufacturing processes), the operations discussed below with reference to FIGS. 3A-3G may be used to form any suitable assemblies.

Figure 3A:
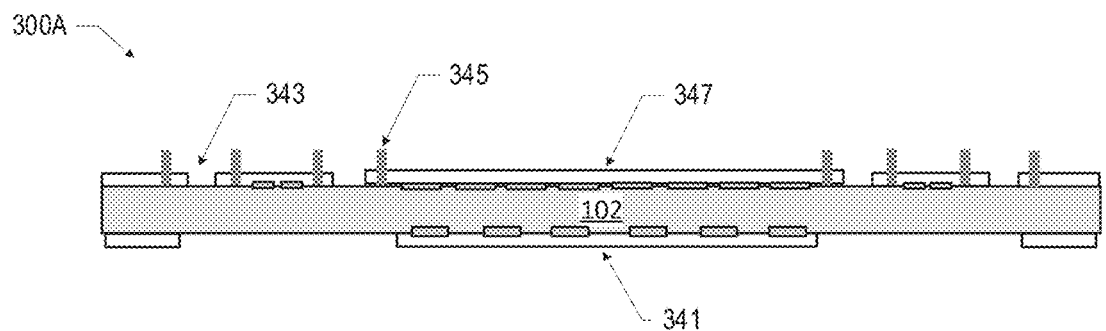
FIGS. 3A-3G are side, cross-sectional views of various stages in an example process for manufacturing a microelectronic assembly, in accordance with various embodiments.

FIG. 3A illustrates an assembly 300A including a package substrate 102 formed to a surface layer subsequent to depositing a solder resist material 347, forming openings 343 in the solder resist material, and forming conductive dams 345 on the surface layer of the package substrate. The solder resist material 347 may be deposited using any suitable technique, for example, lamination, and the solder resist openings 343 may be formed using any suitable technique, for example, plasma etching. The conductive dams 345 may be made of any suitable material, such as copper, and may be formed using any suitable technique, including the process for forming copper structures for first-level interconnects. In some embodiments, a surface finish may be applied, such as an electroless metal or patterned copper to enlarge the available metal area for die attachment. The package substrate 102 may be formed using any suitable technique. In some embodiments, the package substrate 102 may be formed using a lithographically defined via packaging process. In some embodiments, the package substrate 102 may be manufactured using standard organic package manufacturing processes, and thus the package substrate 102 may take the form of an organic package. In some embodiments, the package substrate 102 may be a set of redistribution layers formed on a panel carrier by laminating or spinning on a dielectric material, and creating conductive vias and lines by laser drilling and plating. In some embodiments, the package substrate 102 may be formed on a removable carrier using any suitable technique, such as a redistribution layer technique. Any method known in the art for fabrication of the package substrate 102 may be used, and for the sake of brevity, such methods will not be discussed in further detail herein.

Figure 3B:
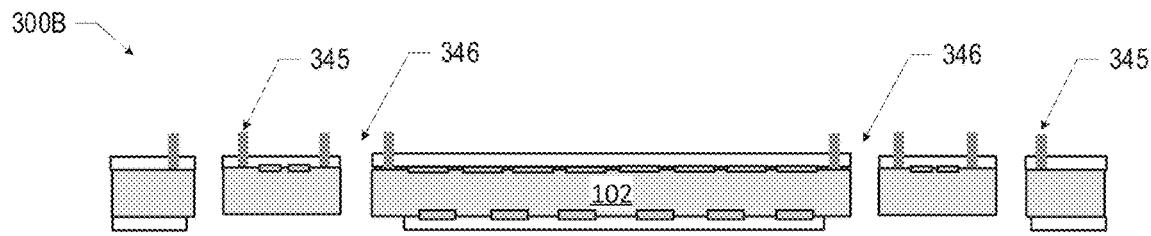

FIG. 3B illustrates an assembly 300B subsequent to forming through holes 346 (e.g., openings) in the package substrate 102. The through holes 346 may be formed by mechanically drilling or laser drilling through the package substrate 102. The through holes 346 may have any suitable dimensions. In some embodiments, the through holes 346 may have a diameter between 50 um and 500 um. In some embodiments, subsequent to drilling the through holes, etching back and desmearing may be performed as well. In some embodiments, the through holes may be plated with a metal (not shown), such as copper, to form a plated through holes (PTH). The plating may be formed by any suitable process, for example, by electroless copper plating.

Figure 3C:
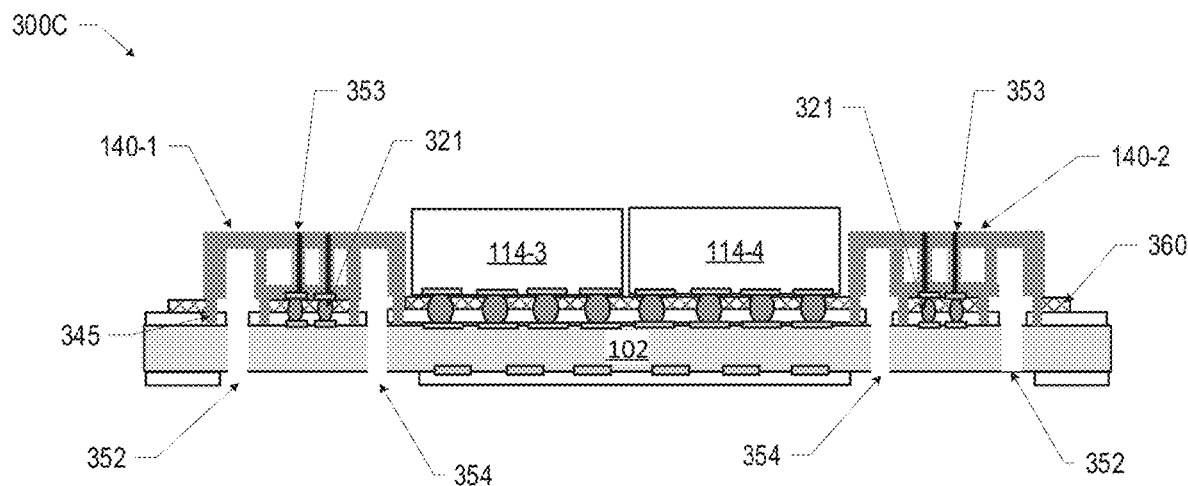

FIG. 3C illustrates an assembly 300C subsequent to attaching cooling interposers 140-1, 140-2 and dies 114-3, 114-4 to the top surface of the assembly 300B. The cooling interposers 140, similar to the dies 114, may be pre-fabricated assemblies that may be surface-mounted to the package substrate 102. The cooling interposers 140 and the dies 114-3, 114-4 may be attached using any suitable process, including, as shown, solder balls, for example, by applying solder, fluxing, performing thermal compression bonding, defluxing, and depositing underfill 360. The cooling interposers 140 may be coupled to the conductive dams 345 to form fluid inlets 352 and fluid outlets 354. The conductive dams 345 may prevent the underfill 360 from entering into the openings 346 (e.g., fluid inlet 352 and fluid outlet 354). Conductive structures 353 in the cooling interposers 140 may be electrically coupled to the package substrate 102 via PSTI interconnects 321 (e.g., solder bumps).

Figure 3D:
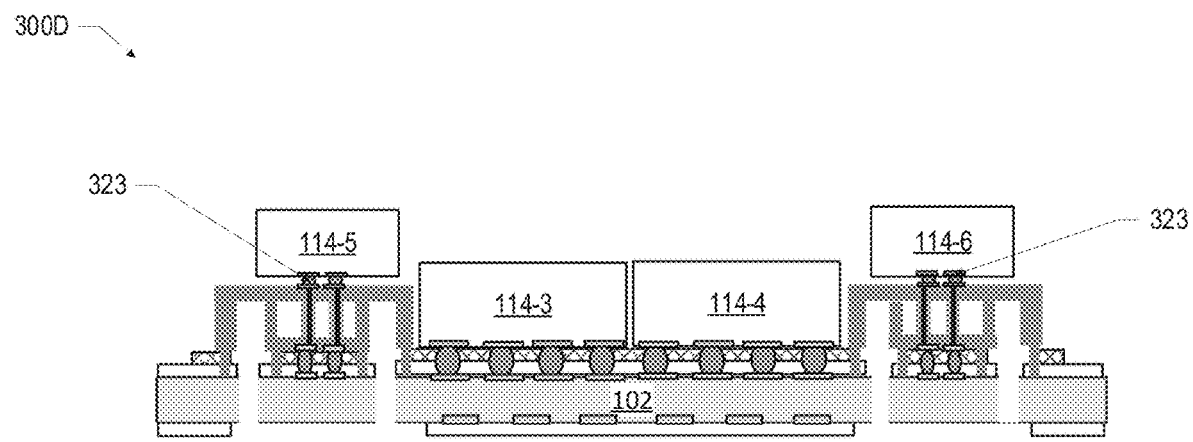

FIG. 3D illustrates an assembly 300D subsequent to attaching dies 114-5, 114-6 to the top surface of the cooling interposers 140-1, 140-2, respectively. The dies 114-5, 114-6 may be attached using any suitable technique, including the process described above with reference to FIG. 3C. The conductive structures 353 in the cooling interposers 140 may be electrically coupled to the dies 114-5, 114-6, respectively, via DTI interconnects 323 (e.g., solder bumps).

Figure 3E:
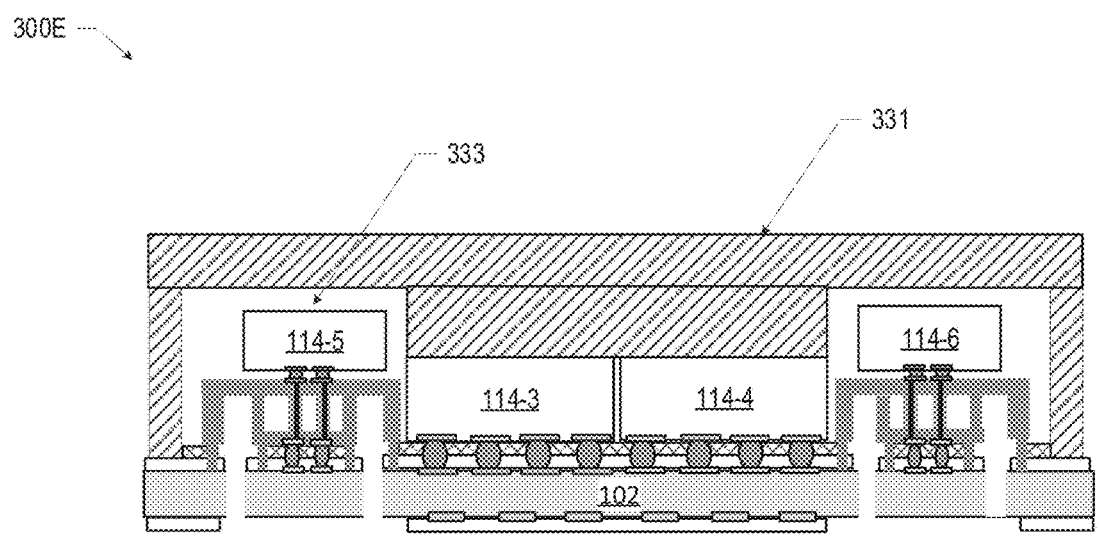

FIG. 3E illustrates an assembly 300E subsequent to attaching a heat spreader 331 to the top surface of the assembly 300D. The heat spreader 331 may be attached using any suitable technique, including, for example, adhesive. The heat spreader 331 may include any suitable thermally conductive material (e.g., metal, appropriate ceramics, etc.), and may include any suitable features (e.g., fins). In some embodiments, as shown, the heat spreader 331 may include an extended portion, or pedestal along the z-height, to account for the difference thicknesses of the dies and to provide physical contact with the dies 114-3, 114-4 while maintaining physical separation 333 from dies 114-5, 114-6. In some embodiments, a TIM (not shown) may be between the bottom surface of the heat spreader and the top surface of the dies 114-3, 114-4, 114-5, and/or 114-6.

Figure 3F:
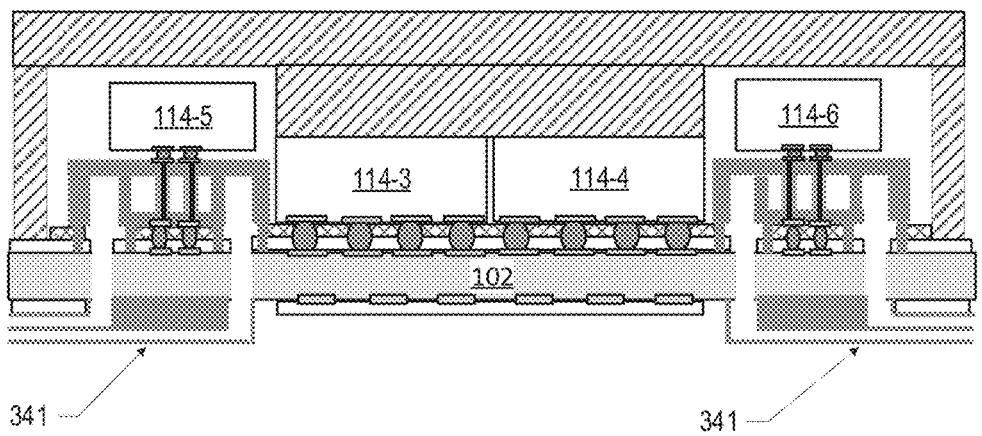

FIG. 3F illustrates an assembly 300F subsequent to attaching fluid pathways 341 to the bottom surface of the assembly 300E. The fluid pathways 341 may be pre-fabricated assemblies that may be attached by any suitable technique, including adhesive. The fluid pathways 341 may be made of any suitable material, including plastic, or metal, and may be formed using any suitable technique, including, for example, molding. The fluid pathways 341 may be attached such that the openings of fluid inlet and fluid outlet align with the openings in the fluid pathways. The fluid pathways 341 may connect to a pump (not shown) for circulating the fluid through the cooling interposer 140.

Figure 3G:
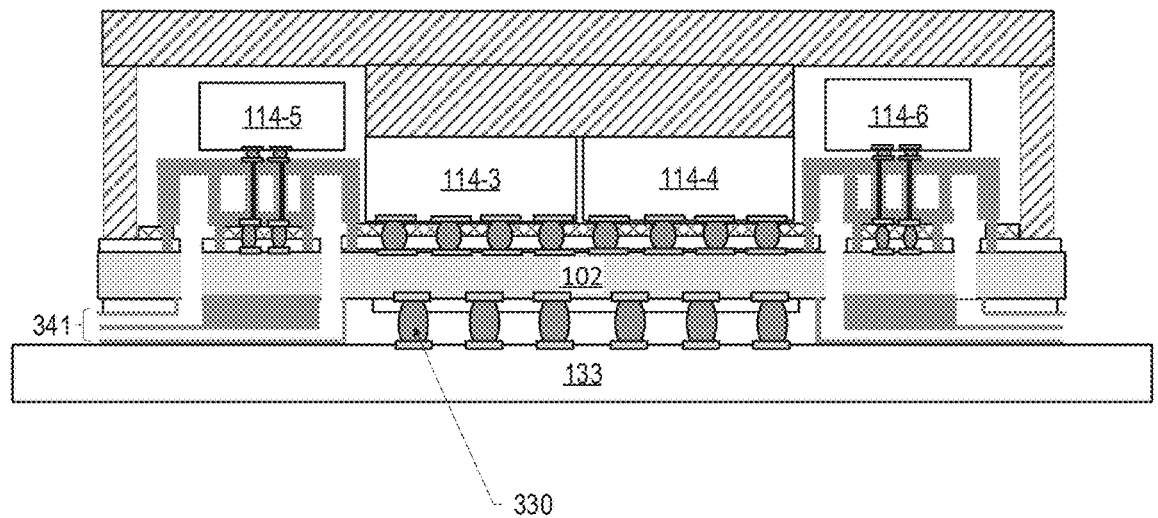

FIG. 3G illustrates an assembly 300G subsequent to mechanically and electrically coupling the assembly 300F to a circuit board 133 via second-level interconnects 330. In some embodiments, the circuit board 133 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 133. In other embodiments, the circuit board 133 may be a non-PCB substrate. The second-level interconnects 330 may include solder balls (as shown in FIG. 3G), male and female portions of a socket, an adhesive, an underfill material, and/or any other suitable electrical and/or mechanical coupling structure. The finished substrate may be a single package substrate or may be a repeating unit that may undergo a singulation process in which each unit is separated from one another to create a single package substrate. The singulation process may occur after solder bump formation process or at any other suitable point in the process.

Figure 4A:
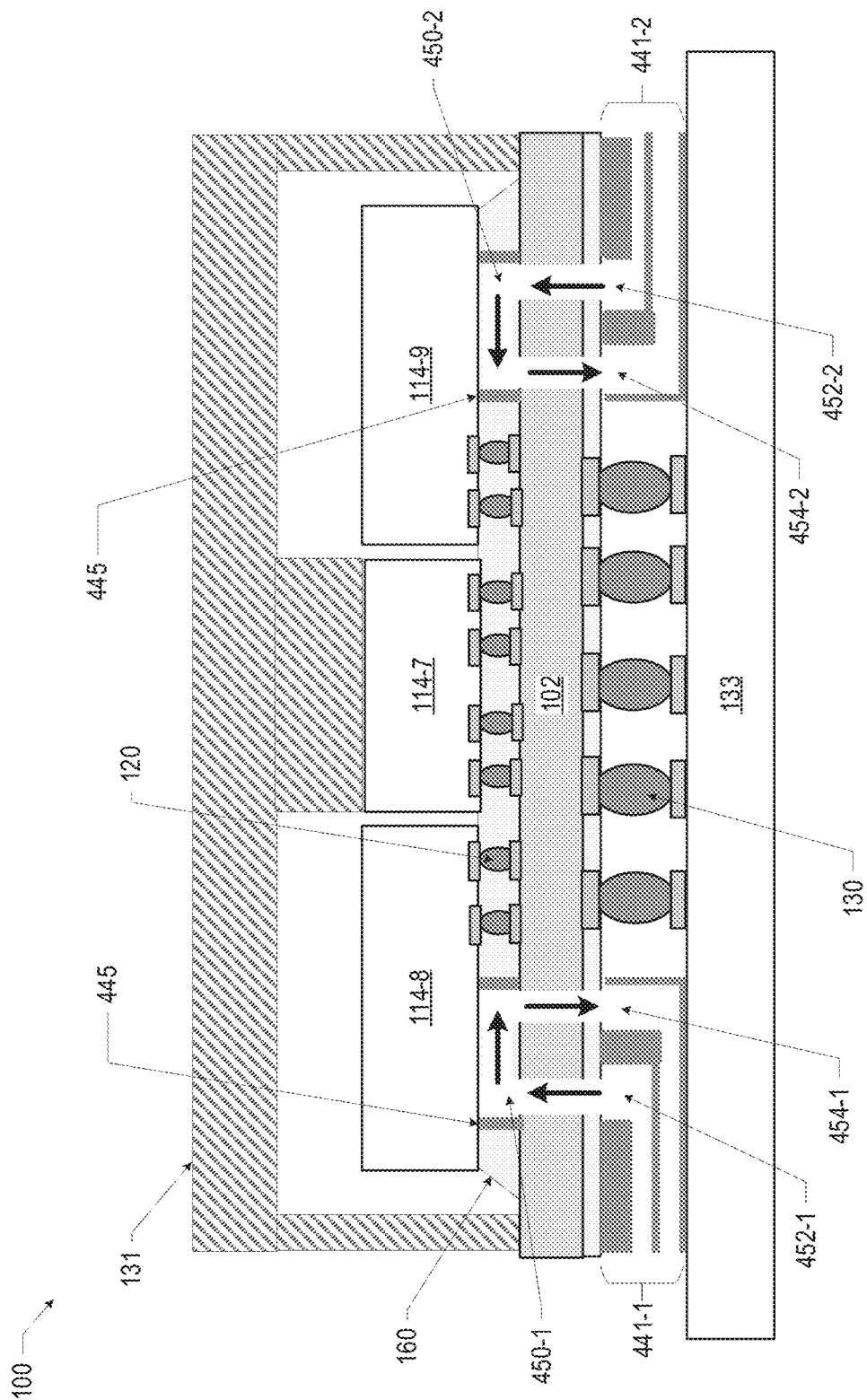
FIGS. 4A-4C are side, cross-sectional views of example microelectronic assemblies having a channel, in accordance with various embodiments.

FIG. 4A is a side, cross-sectional view of a microelectronic assembly 100, in accordance with various embodiments. The microelectronic assembly 100 may include a package substrate 102, a die 114-8, and a cooling channel 450-1 between the die 114-8 and the package substrate 102 connected to a fluid inlet 452-1 and a fluid outlet 454-1, where the fluid inlet 452-1 and the fluid outlet 454-1 are channels through the package substrate 102. The cooling channel 450-1 may be in thermal contact with the die 114-8 to spread heat from the die 114-8. In some embodiments, the cooling channel 450-1 may be in thermal contact with a hotspot on the bottom surface of the die 114-8. The microelectronic assembly 100 may further include a die 114-9 and a cooling channel 450-2 between the die 114-9 and the package substrate 102 connected to a fluid inlet 452-2 and a fluid outlet 454-2, where the fluid inlet 452-2 and the fluid outlet 454-2 are channels through the package substrate 102. The cooling channel 450-2 may be in thermal contact with the die 114-9 to spread heat from the die 114-9. In some embodiments, the cooling channel 450-2 may be in thermal contact with a hotspot on the bottom surface of the die 114-9. In some embodiments, the cooling channel 450 may include more than one fluid inlet 452 and more than one fluid outlet 454. The microelectronic assembly 100 may further include a die 114-7, a heat spreader 131, and a circuit board 133. The dies 114-7, 114-8, 114-9 may be mechanically and electrically coupled to the package substrate 102 via first-level interconnects 120. In some embodiments, an underfill material 160, such as a mold compound or an epoxy, may be disposed around the first-level interconnects 120. In some embodiments, no underfill material may be disposed around the first-level interconnects. The package substrate 102 may be mechanically and electrically coupled to the circuit board 133 via second-level interconnects 130.

The cooling channel 450 may be a hollow structure containing fluid. The cooling channel 450-1 may be defined on the bottom by the top surface of the package substrate 102, on the top by the bottom surface of the die 114-8, and on the four sides by conductive dams 445. The cooling channel 450-2 may be defined on the bottom by the top surface of the package substrate 102, on the top by the bottom surface of the die 114-9, and on the four sides by the conductive dams 445. In some embodiments, the cooling channel 450 may have x-y dimensions equal to the x-y dimensions of the hotspot. In some embodiments, the cooling channel 450 may have x-y dimensions that are greater than the x-y dimensions of the hotspot. The conductive dams 445 may be made of any suitable material, such as copper, and may be formed using any suitable process, such as described above with reference to FIG. 3. The conductive dams 445 may prevent underfill material 160 from flowing into the cooling channel. The conductive dams 445 may have any suitable shape and dimensions to define the cooling channel 450. For example, the conductive dams may have a thickness (e.g., z-height) between 20 um and 100 um (e.g., between 35 um and 65 um). The fluid inlet 452 and fluid outlet 454 may be connected to fluid pathways 441 between the package substrate 102 and the circuit board 133 for circulating fluid through the cooling channel 450. The fluid pathways 441 may be connected to a pump (not shown) for circulating the fluid through the cooling channel 450. In some embodiments, the pump may be mounted on the circuit board 133.

During operation, a fluid may enter via the fluid inlet 452, may flow through the cooling channel 450, and may exit via the fluid outlet 454. The fluid may be circulated through the system via the fluid pathways 441 using a pump or a fan, which may be a separate piece of equipment or may be part of a cooling device. The microelectronic assembly 100 may further include pipes or connections to a heat exchanger, a chiller, or other device for cooling the fluid (not shown) before returning the fluid to the fluid inlet. The fluid may be any suitable liquid or gas, as described above with reference to FIG. 1. In some embodiments, the fluid channels may be bordered by liner materials, such as adhesion liners and/or barrier liners, as suitable. In some embodiments, the fluid channels may not be bordered by liner materials. In some embodiments, the fluid may be an electronic coolant liquid or a dielectric fluid, that is electrically insulating, highly stable, non-toxic, non-corrosive with high thermal conductivity, such that the liquid may be in direct contact with a die 114 and/or a package substrate 102 (e.g., via non-bordered or unsealed channels).

Figure 4B:
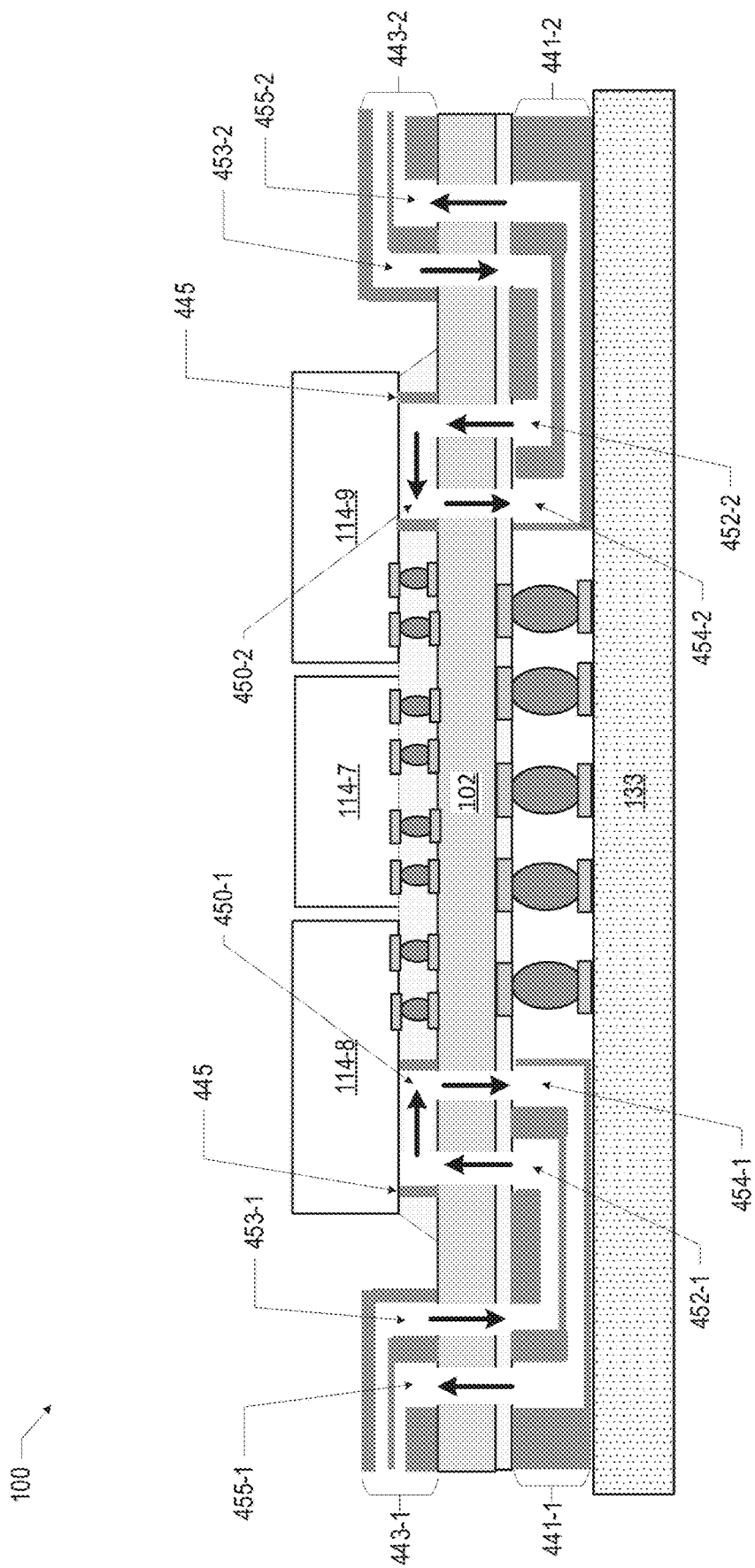

FIG. 4B is a side, cross-sectional view of a microelectronic assembly 100, in accordance with various embodiments. The microelectronic assembly 100 may include a package substrate 102, a die 114-8, and a cooling channel 450-1 between the die 114-8 and the package substrate 102 connected to multiple fluid inlets 452-1, 453-1 and multiple fluid outlets 454-1, 455-1 through the package substrate 102, and to fluid pathways 441-1 on the bottom surface of the package substrate 102 and to fluid pathways 443-1 on the top surface of the package substrate 102. The microelectronic assembly 100 may further include a die 114-9, and a cooling channel 450-2 between the die 114-9 and the package substrate 102 connected to multiple fluid inlets 452-2, 453-2 and multiple fluid outlets 454-2, 455-2 through the package substrate 102, and to fluid pathways 441-2 on the bottom surface of the package substrate 102 and to fluid pathways 443-2 on the top surface of the package substrate 102. The fluid pathways 443 on the top surface of the package substrate 102 may be connected to a pump (not shown) mounted on the top surface of the package substrate 102 for circulating the fluid through the cooling channel 450.

Figure 4C:
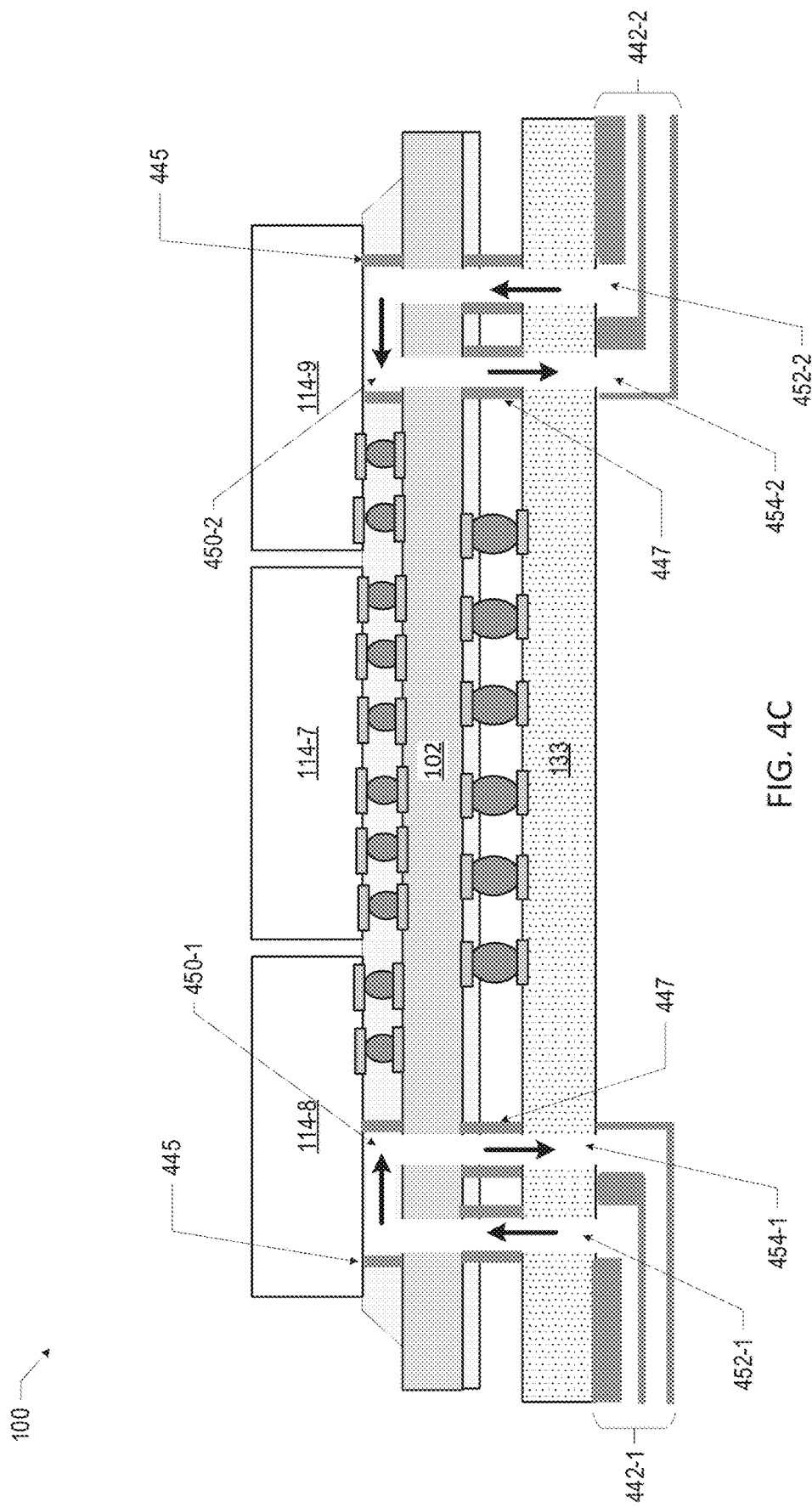

FIG. 4C is a side, cross-sectional view of a microelectronic assembly 100, in accordance with various embodiments. The microelectronic assembly 100 may include a package substrate 102, a die 114-8, and a cooling channel 450-1 between the die 114-8 and the package substrate 102 connected to a fluid inlet 452-1 and a fluid outlet 454-1 where the fluid inlet 452-1 and fluid outlet 454-1 channels extend through the package substrate 102 and the circuit board 133 to connect to fluid pathways 442-1 on the bottom surface of the circuit board 133. The microelectronic assembly 100 may further include a die 114-9, and a cooling channel 450-2 between the die 114-9 and the package substrate 102 connected to a fluid inlet 452-2 and a fluid outlet 454-2 where the fluid inlet 452-2 and fluid outlet 454-2 channels extend through the package substrate 102 and the circuit board 133 to connect to fluid pathways 442-2 on the bottom surface of the circuit board 133. Conductive dams 447 on the top surface of the circuit board 133 may define the fluid inlet 452 and fluid outlet 454 (e.g., extended fluid channels) between the package substrate 102 and the circuit board 133. The fluid channels through the circuit board 133 may be formed using any suitable technique, for example, by mechanical drilling, or may be pre-formed during circuit board manufacturing. The fluid pathways 442 on the bottom surface of the circuit board 133 may be connected to a pump (not shown) mounted on the bottom surface of the circuit board 133 for circulating the fluid through the cooling channel 450.

Although FIG. 4 shows microelectronic assemblies 100 having a particular number and arrangement of cooling channels and dies, a microelectronic assembly 100 may have any suitable number and arrangement of cooling channels 450 and dies 114. Further, although FIG. 4 shows a single cooling channel 450 associated with a single die 114, a microelectronic assembly 100 may have a single cooling channel 450 associated with two or more dies 114, and/or two or more cooling channels 450 associated with a single die 114.

FIGS. 5A-5D are side, cross-sectional views of various stages in an example process for manufacturing the example microelectronic assembly 100 of FIG. 4A, in accordance with various embodiments. Although the operations discussed below with FIGS. 5A-5D (and others of the accompanying drawings representing manufacturing processes) are illustrated in a particular order, these operations may be performed in any suitable order. Additionally, although particular assemblies are illustrated in FIGS. 5A-5D (and others of the accompanying drawings representing manufacturing processes), the operations discussed below with reference to FIGS. 5A-5D may be used to form any suitable assemblies.

Figure 5A:
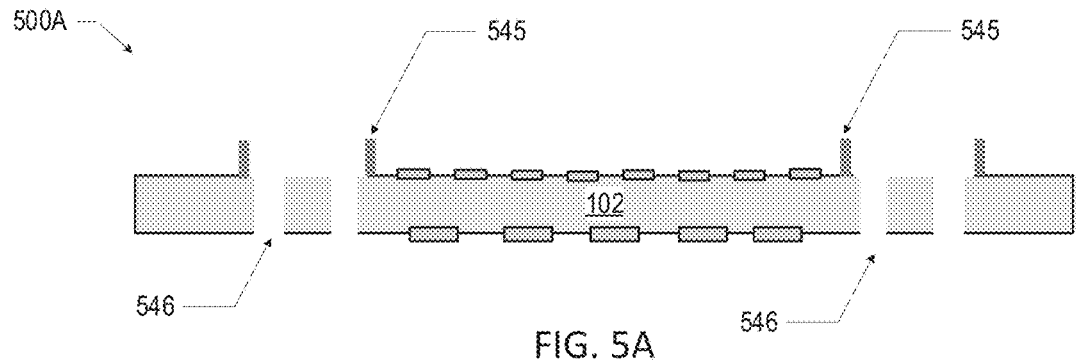
FIGS. 5A-5D are side, cross-sectional views of various stages in an example process for manufacturing the microelectronic assembly of FIG. 4A, in accordance with various embodiments.

FIG. 5A illustrates an assembly 500A including a package substrate 102, where the package substrate is formed until the surface layer, subsequent to forming conductive dams 545 on a top surface of the package substrate 102 and forming through holes 546 through the package substrate 102. The conductive dams 545 and through holes 546 may be formed using any suitable process and may have any suitable dimensions, as described above with reference to FIG. 3. In some embodiments, a solder resist material (not shown) may be deposited and openings may be formed in the solder resist material (e.g., solder resist openings), as described above with reference to FIG. 3.

Figure 5B:
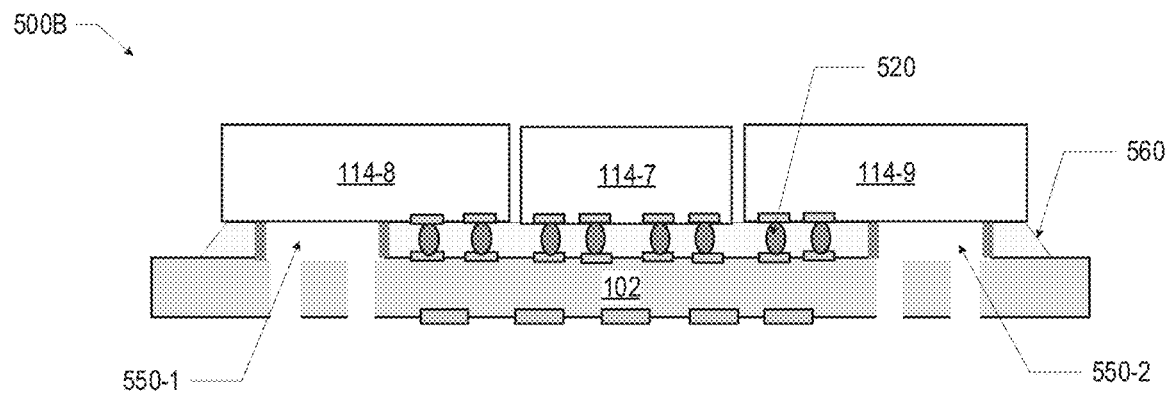

FIG. 5B illustrates an assembly 500B subsequent to attaching the dies 114-7, 114-8, 114-9 to the top surface of the assembly 500A and providing an underfill material 560 between the bottom surface of the dies 114 and the top surface of the package substrate 102. The dies 114-8, 114-9 may be coupled to the conductive dams 545 to form cooling channels 550-1, 550-2, respectively. The dies 114 may be attached using any suitable technique, including techniques described above with reference to FIG. 3. The conductive dams 545 may prevent the underfill material 560 from entering into the openings 546 and the cooling channel 550. The dies 114 may be electrically coupled to the package substrate 102 via first-level interconnects 520 (e.g., solder balls).

Figure 5C:
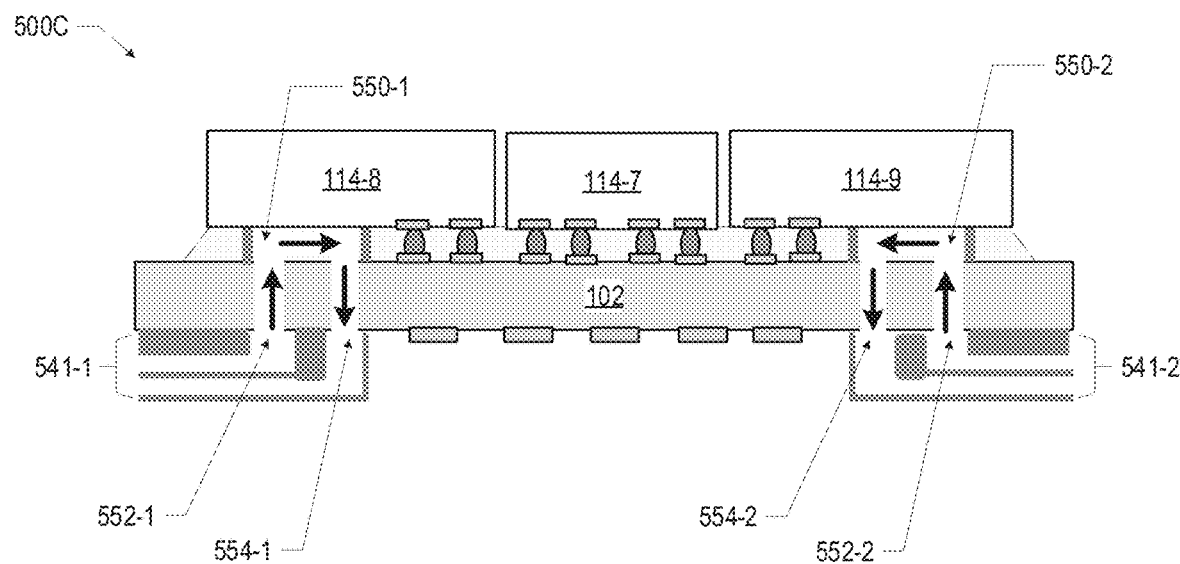

FIG. 5C illustrates an assembly 500C subsequent to attaching fluid pathways 541-1, 541-2 to the bottom surface of the assembly 500B. The fluid pathways 541 may be pre-fabricated assemblies that may be attached by any suitable technique, including adhesive. The fluid pathways 541 may be made of any suitable material, and may be formed using any suitable technique, as described above with reference to FIG. 3. The fluid pathways 541 may be attached such that the openings of a fluid inlet 552 and a fluid outlet 554 align with the openings in the fluid pathways 541 (e.g., fluid inlet 552-1 and fluid outlet 554-1 align with fluid pathways 541-1, and fluid inlet 552-2 and fluid outlet 554-2 align with fluid pathways 541-2). The fluid pathways 541 may connect to a pump (not shown) for circulating the fluid through the fluid inlet 552, the cooling channel 550, and the fluid outlet 554.

Figure 5D:
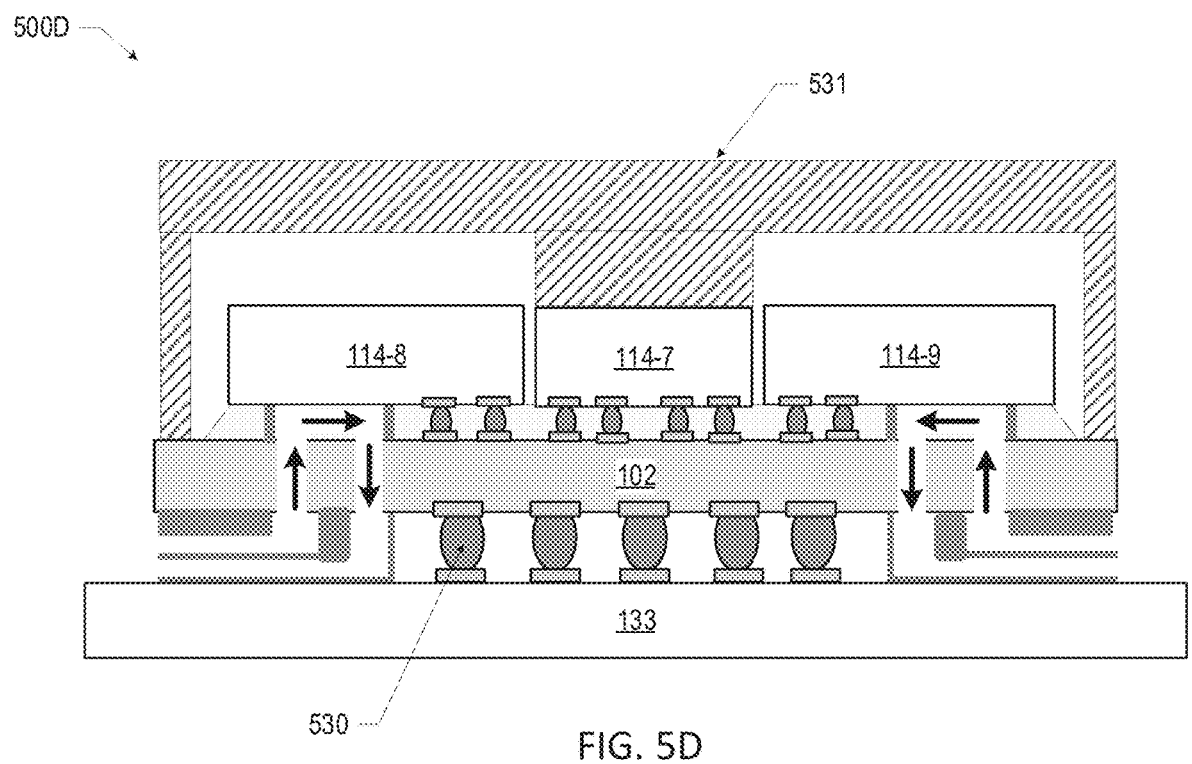

FIG. 5D illustrates an assembly 500D subsequent to attaching a heat spreader 531 to the top surface of the assembly 500C and mechanically and electrically coupling the bottom surface of assembly 500C to a circuit board 133 via second-level interconnects 530. The heat spreader 531 may be made of any suitable material and may be attached using any suitable technique, as described above with reference to FIG. 3. In some embodiments, as shown, the heat spreader 531 may include an extended portion, or pedestal along the z-height, to account for the different thicknesses of the dies and to provide physical contact with the die 114-7 while maintaining physical separation from dies 114-8, 114-9. In some embodiments, a TIM (not shown) may be between the bottom surface of the heat spreader and the top surface of the die 114-7. The circuit board 133 may be formed using any suitable process, as described above with reference to FIG. 3. The second-level interconnects may be any suitable interconnects, as described above with reference to FIG. 3. The finished substrate may be a single package substrate or may be a repeating unit that may undergo a singulation process in which each unit is separated from one another to create a single package substrate. The singulation process may occur after a solder bump formation process or at any other suitable point in the process.

The microelectronic assemblies disclosed herein may be used for any suitable application. For example, in some embodiments, a microelectronic assembly 100 may be used to provide an ultra-high-density and high-bandwidth interconnect for FPGA transceivers and III-V amplifiers. For example, the die 114 may include FPGA transceiver circuitry or III-V amplifiers, and/or FPGA logic. In another example, the die 114 in a microelectronic assembly 100 may be a cache memory (e.g., a third-level cache memory), or a processing device (e.g., a central processing unit, a radio frequency chip, a power converter, a network processor, a graphics processing unit, a FPGA, a modem, an applications processor, etc.).

In another example, one of the dies 114 (e.g., die 114-2, 114-3, 114-4, and/or 114-7) in a microelectronic assembly 100 may be a processing device (e.g., a central processing unit, a radio frequency chip, a power converter, a network processor, a graphics processing unit, a FPGA, a modem, an applications processor, etc.), and another of the dies (e.g., 114-1, 114-5, 114-6, 114-8, and/or 114-9) may include high-bandwidth memory, transceiver circuitry, and/or input/output circuitry (e.g., Double Data Rate transfer circuitry, Peripheral Component Interconnect Express circuitry, etc.).

The microelectronic assemblies disclosed herein may be included in any suitable electronic component. FIGS. 6-9 illustrate various examples of apparatuses that may include, or be included in, any of the microelectronic assemblies disclosed herein.

Figure 6:
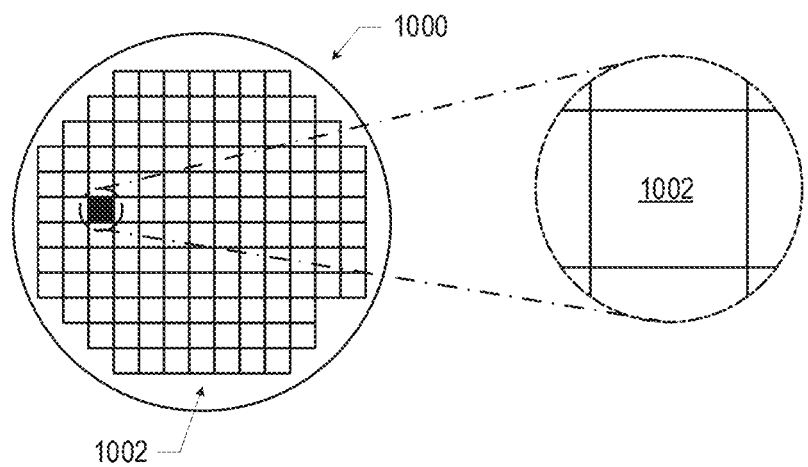
FIG. 6 is a top view of a wafer and dies that may be included in a microelectronic assembly, in accordance with any of the embodiments disclosed herein.

FIG. 6 is a top view of a wafer 1000 and dies 1002 that may be included in any of the microelectronic assemblies disclosed herein (e.g., any of the dies 114 disclosed herein). The wafer 1000 may be composed of semiconductor material and may include one or more dies 1002 having IC structures formed on a surface of the wafer 1000. Each of the dies 1002 may be a repeating unit of a semiconductor product that includes any suitable IC. After the fabrication of the semiconductor product is complete, the wafer 1000 may undergo a singulation process in which the dies 1002 are separated from one another to provide discrete "chips" of the semiconductor product. The die 1002 may be any of the dies 114 disclosed herein. The die 1002 may include one or more transistors (e.g., some of the transistors 1140 of FIG. 7, discussed below), supporting circuitry to route electrical signals to the transistors, passive components (e.g., signal traces, resistors, capacitors, or inductors), and/or any other IC components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processing device (e.g., the processing device 1402 of FIG. 9) or other logic that is configured to store information in the memory devices or execute instructions stored in the memory array. Various ones of the microelectronic assemblies disclosed herein may be manufactured using a die-to-wafer assembly technique in which some dies are attached to a wafer 1000 that include others of the dies, and the wafer 1000 is subsequently singulated.

Figure 7:
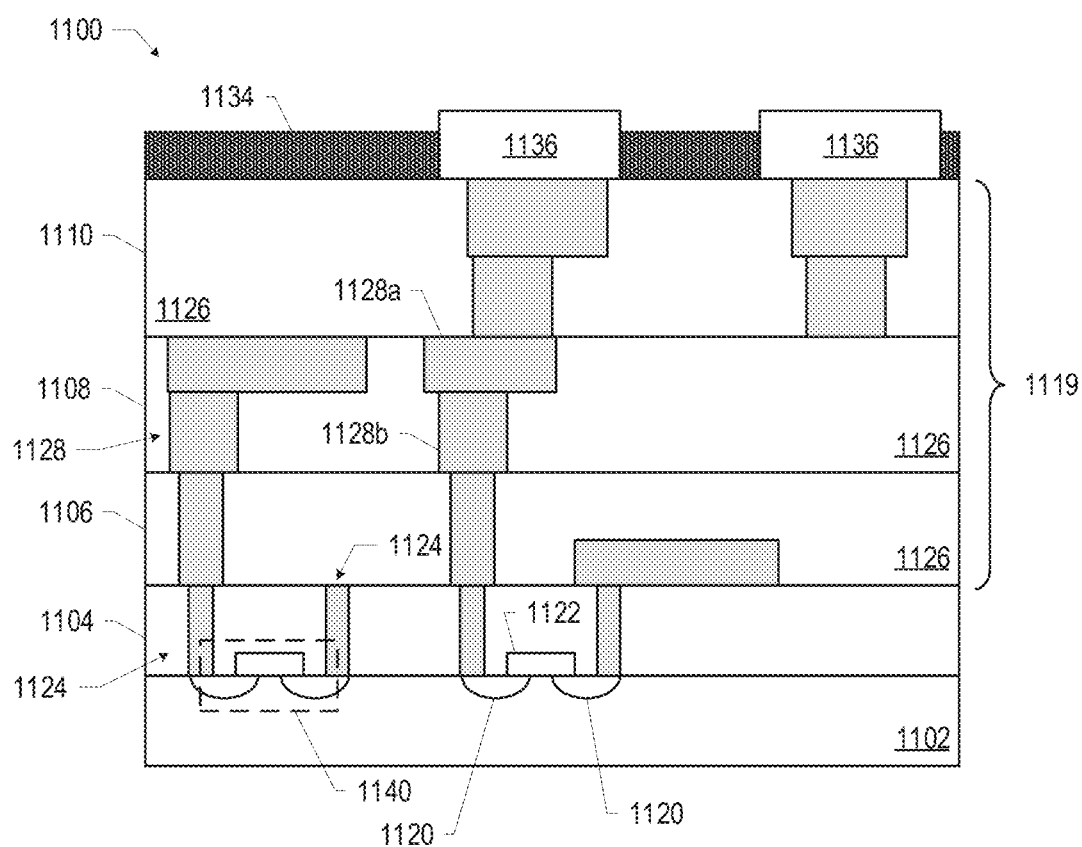
FIG. 7 is a cross-sectional side view of an integrated circuit device that may be included in a microelectronic assembly, in accordance with any of the embodiments disclosed herein.

FIG. 7 is a cross-sectional side view of an example IC device 1100 that may be included in any of the microelectronic assemblies disclosed herein (e.g., in any of the dies 114). One or more of the IC devices 1100 may be included in one or more dies 1002 (FIG. 6). The IC device 1100 may be formed on a substrate 1102 (e.g., the wafer 1000 of FIG. 6) and may be included in a die (e.g., the die 1002 of FIG. 6). The substrate 1102 may be a semiconductor substrate composed of semiconductor material systems including, for example, n-type or p-type materials systems (or a combination of both). The substrate 1102 may include, for example, a crystalline substrate formed using a bulk silicon or a silicon-on-insulator (SOI) substructure. In some embodiments, the substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1102. Although a few examples of materials from which the substrate 1102 may be formed are described here, any material that may serve as a foundation for an IC device 1100 may be used. The substrate 1102 may be part of a singulated die (e.g., the dies 1002 of FIG. 6) or a wafer (e.g., the wafer 1000 of FIG. 6).

The IC device 1100 may include one or more device layers 1104 disposed on the substrate 1102. The device layer 1104 may include features of one or more transistors 1140 (e.g., metal oxide semiconductor field-effect transistors (MOSFETs)) formed on the substrate 1102 and/or any other active and/or passive circuitry as may be desired by a device manufacturer. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 7 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the substrate 1102 adjacent to the gate 1122 of each transistor 1140. The S/D regions 1120 may be formed using an implantation/diffusion process or an etching/deposition process, for example. In the former process, dopants such as boron, aluminum, antimony, phosphorous, or arsenic may be ion-implanted into the substrate 1102 to form the S/D regions 1120. An annealing process that activates the dopants and causes them to diffuse farther into the substrate 1102 may follow the ion-implantation process. In the latter process, the substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 7 as interconnect layers 1106, 1108, and 1110). For example, electrically conductive features of the device layer 1104 (e.g., the gate 1122 and the S/D contacts 1124) may be electrically coupled with interconnect structures 1128 of the interconnect layers 1106-1110. The one or more interconnect layers 1106-1110 may form a metallization stack (also referred to as an "interlayer dielectric (ILD) stack") 1119 of the IC device 1100.

The interconnect structures 1128 may be arranged within the interconnect layers 1106-1110 to route electrical signals according to a wide variety of designs. In particular, the arrangement is not limited to the particular configuration of interconnect structures 1128 depicted in FIG. 7. For example, the interconnect structures may be arranged as multidirectional interconnect structures. Although a particular number of interconnect layers 1106-1110 is depicted in FIG. 7, embodiments of the present disclosure include IC devices having more or fewer interconnect layers than depicted.

In some embodiments, the interconnect structures 1128 may include lines 1128a and/or vias 1128b filled with an electrically conductive material such as a metal. The lines 1128a may be arranged to route electrical signals in a direction of a plane that is substantially parallel with a surface of the substrate 1102 upon which the device layer 1104 is formed. For example, the lines 1128a may route electrical signals in a direction in and out of the page from the perspective of FIG. 7. The vias 1128b may be arranged to route electrical signals in a direction of a plane that is substantially perpendicular to the surface of the substrate 1102 upon which the device layer 1104 is formed. In some embodiments, the vias 1128b may electrically couple lines 1128a of different interconnect layers 1106-1110 together.

The interconnect layers 1106-1110 may include a dielectric material 1126 disposed between the interconnect structures 1128, as shown in FIG. 7. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same.

A first interconnect layer 1106 (referred to as Metal 1 or "M1") may be formed directly on the device layer 1104. In some embodiments, the first interconnect layer 1106 may include lines 1128a and/or vias 1128b, as shown. The lines 1128a of the first interconnect layer 1106 may be coupled with contacts (e.g., the S/D contacts 1124) of the device layer 1104.

A second interconnect layer 1108 (referred to as Metal 2 or "M2") may be formed directly on the first interconnect layer 1106. In some embodiments, the second interconnect layer 1108 may include vias 1128b to couple the lines 1128a of the second interconnect layer 1108 with the lines 1128a of the first interconnect layer 1106. Although the lines 1128a and the vias 1128b are structurally delineated with a line within each interconnect layer (e.g., within the second interconnect layer 1108) for the sake of clarity, the lines 1128a and the vias 1128b may be structurally and/or materially contiguous (e.g., simultaneously filled during a dual-damascene process) in some embodiments.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the IC device 1100 (i.e., farther away from the device layer 1104) may be thicker.

The IC device 1100 may include a solder resist material 1134 (e.g., polyimide or similar material) and one or more conductive contacts 1136 formed on the interconnect layers 1106-1110. In FIG. 7, the conductive contacts 1136 are illustrated as taking the form of bond pads. The conductive contacts 1136 may be electrically coupled with the interconnect structures 1128 and configured to route the electrical signals of the transistor(s) 1140 to other external devices. For example, solder bonds may be formed on the one or more conductive contacts 1136 to mechanically and/or electrically couple a chip including the IC device 1100 with another component (e.g., a circuit board). The IC device 1100 may include additional or alternate structures to route the electrical signals from the interconnect layers 1106-1110; for example, the conductive contacts 1136 may include other analogous features (e.g., posts) that route the electrical signals to external components. The conductive contacts 1136 may serve as the conductive contacts 122 or 124, as appropriate.

In embodiments in which the IC device 1100 is a double-sided die (e.g., like the die 114), the IC device 1100 may include another metallization stack (not shown) on the opposite side of the device layer(s) 1104. This metallization stack, may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the IC device 1100 from the conductive contacts 1136.

Figure 8:
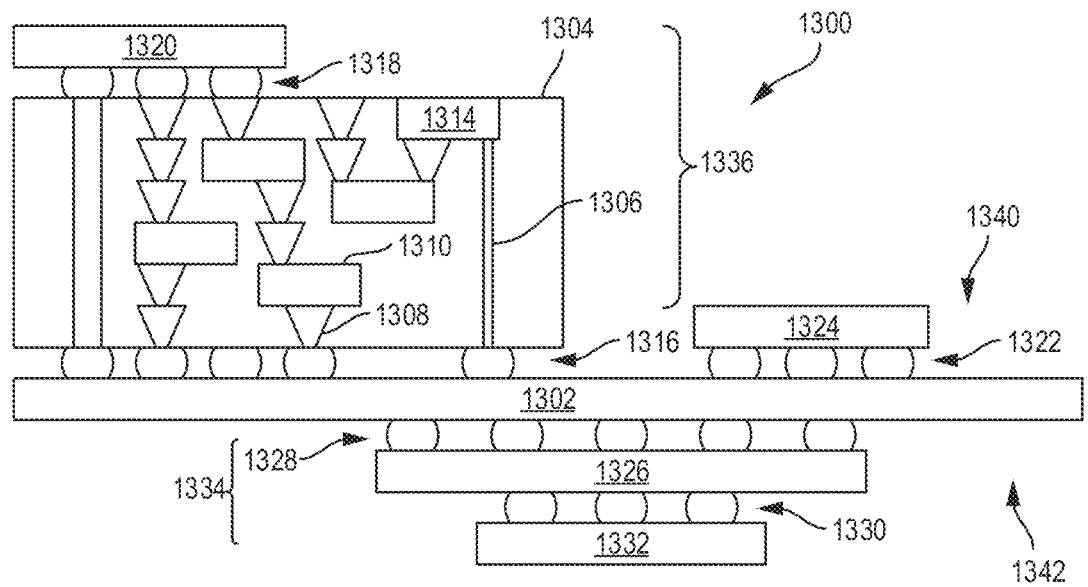
FIG. 8 is a cross-sectional side view of an integrated circuit device assembly that may include a microelectronic assembly, in accordance with any of the embodiments disclosed herein.

FIG. 8 is a cross-sectional side view of an IC device assembly 1300 that may include any of the microelectronic assemblies disclosed herein. In some embodiments, the IC device assembly 1300 may be a microelectronic assembly 100. The IC device assembly 1300 includes a number of components disposed on a circuit board 1302 (which may be, e.g., a motherboard). The IC device assembly 1300 includes components disposed on a first surface 1340 of the circuit board 1302 and an opposing second surface 1342 of the circuit board 1302; generally, components may be disposed on one or both surfaces 1340 and 1342. Any of the IC packages discussed below with reference to the IC device assembly 1300 may take the form of any suitable ones of the embodiments of the microelectronic assemblies disclosed herein.

In some embodiments, the circuit board 1302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 8 includes a package-on-interposer structure 1336 coupled to the first surface 1340 of the circuit board 1302 by coupling components 1316. The coupling components 1316 may electrically and mechanically couple the package-on-interposer structure 1336 to the circuit board 1302, and may include solder balls (as shown in FIG. 8), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 8, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1002 of FIG. 6), or any other suitable component. Generally, the interposer 1304 may spread a connection to a wider pitch or reroute a connection to a different connection. For example, the interposer 1304 may couple the IC package 1320 (e.g., a die) to a set of ball grid array (BGA) conductive contacts of the coupling components 1316 for coupling to the circuit board 1302. In the embodiment illustrated in FIG. 8, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to TSVs 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first surface 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 8 includes a package-on-package structure 1334 coupled to the second surface 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 9:
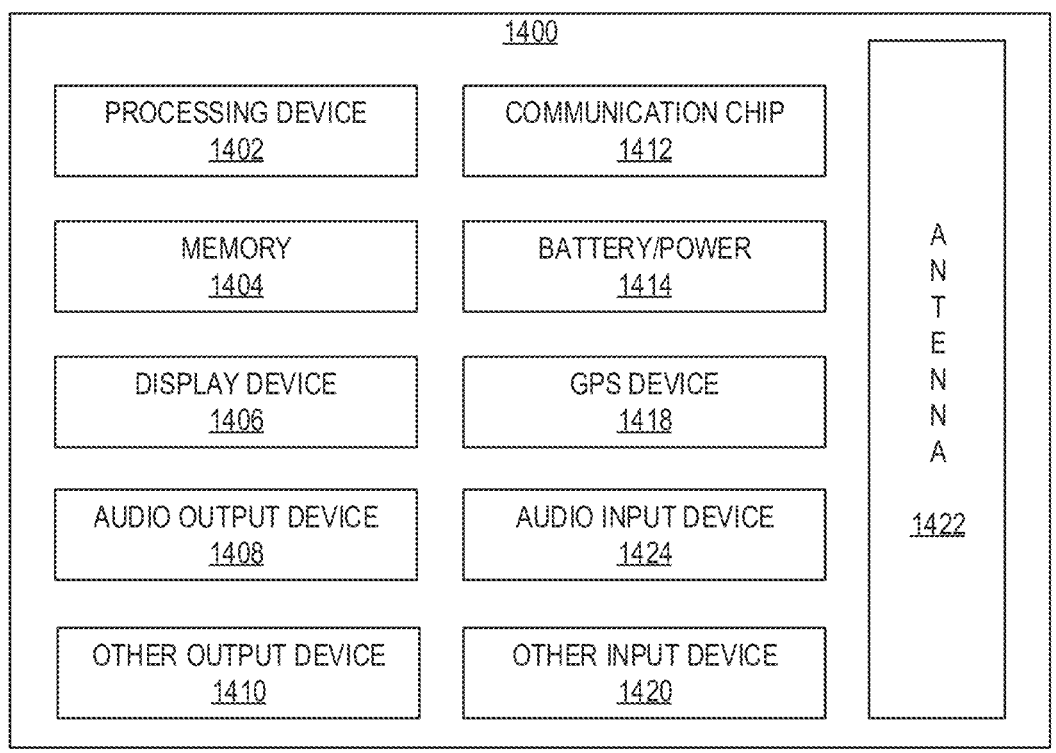
FIG. 9 is a block diagram of an example electrical device that may include a microelectronic assembly, in accordance with any of the embodiments disclosed herein.

FIG. 9 is a block diagram of an example electrical device 1400 that may include one or more of the microelectronic assemblies disclosed herein. For example, any suitable ones of the components of the electrical device 1400 may include one or more of the IC device assemblies 1300, IC devices 1100, or dies 1002 disclosed herein, and may be arranged in any of the microelectronic assemblies disclosed herein. A number of components are illustrated in FIG. 9 as included in the electrical device 1400, but any one or more of these components may be omitted or duplicated, as suitable for the application. In some embodiments, some or all of the components included in the electrical device 1400 may be attached to one or more motherboards. In some embodiments, some or all of these components are fabricated onto a single system-on-a-chip (SoC) die.

Additionally, in various embodiments, the electrical device 1400 may not include one or more of the components illustrated in FIG. 9, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), CPUs, GPUs, cryptoprocessors (specialized processors that execute cryptographic algorithms within hardware), server processors, or any other suitable processing devices. The electrical device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random access memory (STT-MRAM).

In some embodiments, the electrical device 1400 may include a communication chip 1412 (e.g., one or more communication chips). For example, the communication chip 1412 may be configured for managing wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as global positioning system (GPS), EDGE, GPRS, CDMA, WiMAX, LTE, EV-DO, or others. In some embodiments, a first communication chip 1412 may be dedicated to wireless communications, and a second communication chip 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any device that generates an audible indicator, such as speakers, headsets, or earbuds.

The electrical device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The electrical device 1400 may include a GPS device 1418 (or corresponding interface circuitry, as discussed above). The GPS device 1418 may be in communication with a satellite-based system and may receive a location of the electrical device 1400, as known in the art.

The electrical device 1400 may include another output device 1410 (or corresponding interface circuitry, as discussed above). Examples of the other output device 1410 may include an audio codec, a video codec, a printer, a wired or wireless transmitter for providing information to other devices, or an additional storage device.

The electrical device 1400 may include another input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1400 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1400 may be any other electronic device that processes data.

The following paragraphs provide various examples of the embodiments disclosed herein.

Example 1 is a microelectronic assembly, including: a package substrate having a first surface and an opposing second surface; a die having a surface; and a fluidic channel between the surface of the die and the second surface of the package substrate, wherein a top surface of the fluidic channel is defined by the surface of the die and a bottom surface of the fluidic channel is defined by the second surface of the package substrate.

Example 2 may include the subject matter of Example 1, and may further specify that the fluidic channel is defined on a first side by a first conductive dam, on a second side by a second conductive dam, on a third side by a third conductive dam, and on a fourth side by a fourth conductive dam.

Example 3 may include the subject matter of Example 1, and may further include: a fluid in the fluidic channel, wherein the fluid includes a dielectric liquid.

Example 4 may include the subject matter of Example 1, and may further include: a fluid inlet connected to the fluidic channel, wherein at least a portion of the fluid inlet is through the package substrate; and a fluid outlet connected to the fluidic channel, wherein at least a portion of the fluid outlet is through the package substrate.

Example 5 may include the subject matter of Example 4, and may further include: fluid pathways connected to the fluid inlet and the fluid outlet, wherein the fluid pathways are on the second surface of the package substrate.

Example 6 may include the subject matter of Example 4, and may further include: a circuit board having a surface; and fluid pathways connected to the fluid inlet and the fluid outlet, wherein the fluid pathways are between the first surface of the package substrate and the surface of the circuit board.

Example 7 may include the subject matter of Example 1, and may further specify that the die includes high-bandwidth memory.

Example 8 is a microelectronic assembly, including: a package substrate having a surface; a die having a surface; and an interposer between the surface of the die and the surface of the package substrate, wherein the interposer includes a fluidic channel.

Example 9 may include the subject matter of Example 8, and may further specify that the fluidic channel is one of a plurality of fluidic channels, and wherein the interposer further includes: a vertical wall in contact with the plurality of fluidic channels.

Example 10 may include the subject matter of Example 9, and may further include: a conductive structure extending through the vertical wall.

Example 11 may include the subject matter of Example 10, and may further specify that the conductive structure is coupled to the package substrate via first interconnects and coupled to the die via second interconnects, and wherein the first interconnects or the second interconnects include solder.

Example 12 may include the subject matter of Example 8, and may further specify that the interposer further includes: a plurality of vertical posts.

Example 13 may include the subject matter of Example 12, and may further specify that an individual one of the plurality of vertical posts further includes: a conductive structure extending through the vertical post.

Example 14 may include the subject matter of Example 13, and may further specify that the conductive structure is coupled to the package substrate via first interconnects and coupled to the die via second interconnects, and wherein the first interconnects or the second interconnects include solder.

Example 15 may include the subject matter of Example 12, and may further specify that the plurality of vertical posts has a linear arrangement.

Example 16 may include the subject matter of Example 12, and may further specify that the plurality of vertical posts has a non-linear arrangement.

Example 17 may include the subject matter of Example 12, and may further specify that an individual one of the plurality of vertical posts has a cross-section that is circular.

Example 18 may include the subject matter of Example 12, and may further specify that an individual one of the plurality of vertical posts has a cross-section that is non-circular.

Example 19 may include the subject matter of Example 8, and may further specify that the interposer includes silicon.

Example 20 may include the subject matter of Example 8, and may further specify that the die is a stacked die.

Example 21 is a computing device, including: a package substrate having a first surface and an opposing second surface; a die having a surface; a fluidic channel between the surface of the die and the second surface of the package substrate, wherein the fluidic channel is defined by the surface of the die and by the second surface of the package substrate; a fluid pathway connected to the fluidic channel, where at least a portion of the fluid pathway is through the package substrate; and a circuit board having a first surface and an opposing second surface, wherein the first surface of the package substrate is coupled to the second surface of the circuit board.

Example 22 may include the subject matter of Example 21, and may further specify that at least a portion of the fluid pathway is between the first surface of the package substrate and the second surface of the circuit board.

Example 23 may include the subject matter of Example 21, and may further specify that at least a portion of the fluid pathway is on the second surface of the package substrate.

Example 24 may include the subject matter of Example 21, and may further specify that at least a portion of the fluid pathway is through the circuit board.

Example 25 may include the subject matter of Example 24, and may further specify that at least a portion of the fluid pathway is on the first surface of the circuit board.

Example 26 may include the subject matter of Example 21, and may further include: a fluid in the fluidic channel, wherein the fluid includes a dielectric liquid.

Example 27 may include the subject matter of Example 21, and may further specify that the die is a first die, and may further include: a second die having a first surface and an opposing second surface, wherein the first surface of the second die is coupled to the second surface of the package substrate; and a heat spreader, wherein the heat spreader is in thermal contact with the second surface of the second die.

Example 28 is a method of manufacturing a microelectronic assembly, including: forming a first conductive dam, a second conductive dam, a third conductive dam, and a fourth conductive dam on a surface of a package substrate, wherein the first conductive dam defines a first sidewall of a channel, the second conductive dam defines a second sidewall of the channel, the third conductive dam defines a third sidewall of the channel, and the fourth conductive dam defines a fourth sidewall of the channel; forming an opening through the package substrate, where the opening is between the first, second, third, and fourth conductive dams; and connecting a fluid pathway to the opening.

Example 29 may include the subject matter of Example 28, and may further specify that the opening is a first opening and the fluid pathway is a first fluid pathway, and may further include: forming a second opening through the package substrate, where the second opening is between the first, second, third, and fourth conductive dams; and connecting a second fluid pathway to the second opening.

Example 30 may include the subject matter of Example 28, and may further include: coupling a surface of a die to the surface of the package substrate, wherein at least a portion of the die covers the first, second, third, and fourth conductive dams, and wherein a top surface of the channel is defined by the surface of the die.

Example 31 may include the subject matter of Example 30, and may further include: depositing an underfill material around the channel between the surface of the die and the surface of the package substrate.

Example 32 is a method of manufacturing a microelectronic assembly, including: forming a first conductive dam structure on a surface of a package substrate, wherein the first conductive dam structure includes four sidewalls that are connected to form an enclosed structure; forming a first opening through the package substrate, where the first opening is within the first conductive dam structure; forming a second conductive dam structure on a surface of a package substrate, wherein the second conductive dam structure includes four sidewalls that are connected to form an enclosed structure; forming a second opening through the package substrate, where the second opening is within the second conductive dam structure; coupling an interposer having a fluidic channel to the surface of the package substrate; wherein a fluid inlet of the interposer is aligned with the first opening and a fluid outlet of the interposer is aligned with the second opening; connecting a first fluid pathway to the first opening; and connecting a second fluid pathway to the second opening.

Example 33 may include the subject matter of Example 32, and may further specify that the interposer has a first surface and an opposing second surface, and wherein the first surface of the interposer is coupled to the surface of the package substrate, and may further include: coupling a die to the second surface of the interposer.

Example 34 may include the subject matter of Example 33, and may further specify that the interposer includes a conductive structure through the interposer, and wherein the conductive structure is coupled to the package substrate at the first surface of the interposer via first interconnects and is coupled to the die at the second surface of the interposer via second interconnects.

Example 35 may include the subject matter of Example 32, and may further include: depositing a solder resist material on the surface of the package substrate; and removing solder resist material to form solder resist openings, where the solder resist openings align with the first and second openings through the package substrate.

The invention claimed is:

1. A microelectronic assembly, comprising:
a package substrate having a first surface and an opposing second surface, wherein the package substrate includes a first fluidic channel, a second fluidic channel, a third fluidic channel and a fourth fluidic channel extending through the package substrate from the first surface to the second surface of the package substrate;
a die having a surface at the second surface of the package substrate, wherein the surface of the die is electrically coupled to the second surface of the package substrate by first interconnects;
a fifth fluidic channel between the surface of the die and the second surface of the package substrate connecting the third and fourth fluidic channels, wherein a top surface of the fifth fluidic channel is defined by the surface of the die and a bottom surface of the fifth fluidic channel is defined by the second surface of the package substrate, wherein the fifth fluidic channel is adjacent to the first interconnects;
a circuit board having a surface at the first surface of the package substrate, wherein the first surface of the package substrate is electrically coupled to the surface of the circuit board by second interconnects;
a first fluid pathway between the first surface of the package substrate and the surface of the circuit board connecting the second and third fluidic channels; and
a second fluid pathway between the first surface of the package substrate and the surface of the circuit board connecting the fourth and first fluidic channels, wherein the first and the second fluid pathways are adjacent to the second interconnects.

2. The microelectronic assembly of claim 1, wherein the fifth fluidic channel between the surface of the die and the second surface of the package substrate is defined on a first side by a first conductive dam and on a second side by a second conductive dam.

3. The microelectronic assembly of claim 1, further comprising:
a fluid in the first, second, third, fourth, and fifth fluidic channels and in the first and second fluid pathways, wherein the fluid includes a dielectric liquid.

4. The microelectronic assembly of claim 1, further comprising:
a fluid inlet connected to the first fluidic channel at the second surface of the package substrate; and
a fluid outlet connected to the fourth fluidic channel, at the second surface of the package substrate.

5. The microelectronic assembly of claim 4, further comprising:
a third fluid pathway connected to the fluid inlet and a fourth fluid pathway connected to the fluid outlet, wherein the third and fourth fluid pathways are on the second surface of the package substrate.

6. The microelectronic assembly of claim 1, wherein the die includes high-bandwidth memory.

7. A microelectronic assembly, comprising:
an interposer having a first surface and an opposing second surface, wherein the interposer includes a vertical structure connecting the first surface and the second surface forming a first fluidic channel through the interposer, and wherein the vertical structure includes a conductive pathway between the first and second surfaces of the interposer;
a die at the second surface of the interposer, wherein the die is electrically coupled to the conductive pathway in the interposer by a first interconnect;
a package substrate having a first surface and an opposing second surface, wherein the second surface of the package substrate is at the first surface of the interposer, wherein the package substrate is electrically coupled to the conductive pathway in the interposer by a second interconnect and electrically coupled to the die by the second interconnect, the conductive pathway, and the first interconnect, wherein the package substrate includes a second fluidic channel and a third fluidic channel extending through the package substrate from the first surface to the second surface of the package substrate, and wherein the second and third fluidic channels are connected to the first fluidic channel;
a first fluid pathway at the first surface of the package substrate connected to the second fluidic channel; and
a second fluid pathway at the first surface of the package substrate connected to the third fluidic channel.

8. The microelectronic assembly of claim 7, wherein the vertical structure includes a vertical wall.

9. The microelectronic assembly of claim 8, wherein the first or second interconnects include solder.

10. The microelectronic assembly of claim 7, wherein the vertical structure includes a vertical post.

11. The microelectronic assembly of claim 10, wherein the first or second interconnects include solder.

12. The microelectronic assembly of claim 10, wherein the vertical post is one of a plurality of vertical posts and the plurality of vertical posts have a linear arrangement.

13. The microelectronic assembly of claim 10, wherein the vertical post is one of a plurality of vertical posts and the plurality of vertical posts have a non-linear arrangement.

* * * * *